United States Patent
Hayashishita

(10) Patent No.: US 12,165,904 B2
(45) Date of Patent: Dec. 10, 2024

(54) COMPONENT MANUFACTURING DEVICE AND COMPONENT MANUFACTURING METHOD

(71) Applicant: MITSUI CHEMICALS TOHCELLO, INC., Tokyo (JP)

(72) Inventor: Eiji Hayashishita, Nagoya (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 1340 days.

(21) Appl. No.: 16/621,985

(22) PCT Filed: May 30, 2018

(86) PCT No.: PCT/JP2018/020852
§ 371 (c)(1),
(2) Date: Dec. 12, 2019

(87) PCT Pub. No.: WO2018/235554
PCT Pub. Date: Dec. 27, 2018

(65) Prior Publication Data
US 2021/0151340 A1    May 20, 2021

(30) Foreign Application Priority Data
Jun. 23, 2017   (JP) .................................. 2017-123544

(51) Int. Cl.
*H01L 21/687* (2006.01)
*H01L 21/677* (2006.01)
*H01L 23/12* (2006.01)

(52) U.S. Cl.
CPC .......... *H01L 21/687* (2013.01); *H01L 21/677* (2013.01); *H01L 23/12* (2013.01)

(58) Field of Classification Search
None
See application file for complete search history.

(56) References Cited

U.S. PATENT DOCUMENTS 8,283,606 B2    10/2012   Hayashi
9,653,334 B2    5/2017    Matsubara et al.
(Continued)

FOREIGN PATENT DOCUMENTS

JP    2006287235 A    10/2006
JP    2009076689 A    4/2009
(Continued)

OTHER PUBLICATIONS

Translation of JP-2013080812-A (Year: 2013).*
(Continued)

*Primary Examiner* — Elizabeth M Kerr
(74) *Attorney, Agent, or Firm* — Panitch Schwarzde Belisario & Nadel LLP

(57) ABSTRACT

In order to provide a component manufacturing apparatus and a component manufacturing method that can normally chuck and fix a component holding film to a chuck table in a heated state, the present component manufacturing apparatus 1 includes a chucking and fixing means 20 that chucks and fixes a component holding film to a heated chucking surface 21a, and a preventing means 30 that prevents heat convection, occurring on the chucking surface 21a, from contacting the film. The present component manufacturing method includes a setting step of chucking and fixing the film to the heated chucking surface 21a, and the setting step includes a preventing step of preventing heat convection, occurring on the chucking surface 21a, from contacting the film.

13 Claims, 10 Drawing Sheets

(56) References Cited

U.S. PATENT DOCUMENTS

| | | | |
|---|---|---|---|
| 2002/0003037 A1* | 1/2002 | Cousineau | H01L 21/67248 |
| | | | 165/206 |
| 2006/0220262 A1 | 10/2006 | Meyer et al. | |
| 2008/0128884 A1 | 6/2008 | Meyer et al. | |
| 2009/0078694 A1 | 3/2009 | Hayashi | |
| 2012/0141786 A1* | 6/2012 | Uh | C08G 18/6254 |
| | | | 526/348 |
| 2012/0237885 A1* | 9/2012 | Alexander | H01L 21/67109 |
| | | | 432/5 |
| 2015/0340203 A1* | 11/2015 | Matsubara | H01J 37/321 |
| | | | 118/723 R |

FOREIGN PATENT DOCUMENTS

| | | | |
|---|---|---|---|
| JP | 2011187910 A | | 9/2011 |
| JP | 2013080812 A | * | 5/2013 |
| JP | 2015225890 A | | 12/2015 |
| JP | 2016142649 A | * 8/2016 | G01R 31/26 |

OTHER PUBLICATIONS

Translation of JP-2016142649-A (Year: 2016).*

International Search Report (PCT/ISA/210) and translation and Written Opinion (PCT/ISA/237) mailed on Aug. 14, 2018, by the Japanese Patent Office as the International Searching Authority for International Application No. PCT/JP2018/020852.

Extended European Search Report issued Feb. 23, 2021, by the European Patent Office in corresponding European Patent Application No. 18820357.4-1211. (8 pages).

Office Action (The Notification of the First Office Action) issued Mar. 17, 2023, by the National Intellectual Property Administration, P. R. China in corresponding Chinese Patent Application No. 201880041711.X and an English translation of the Office Action. (12 pages).

* cited by examiner

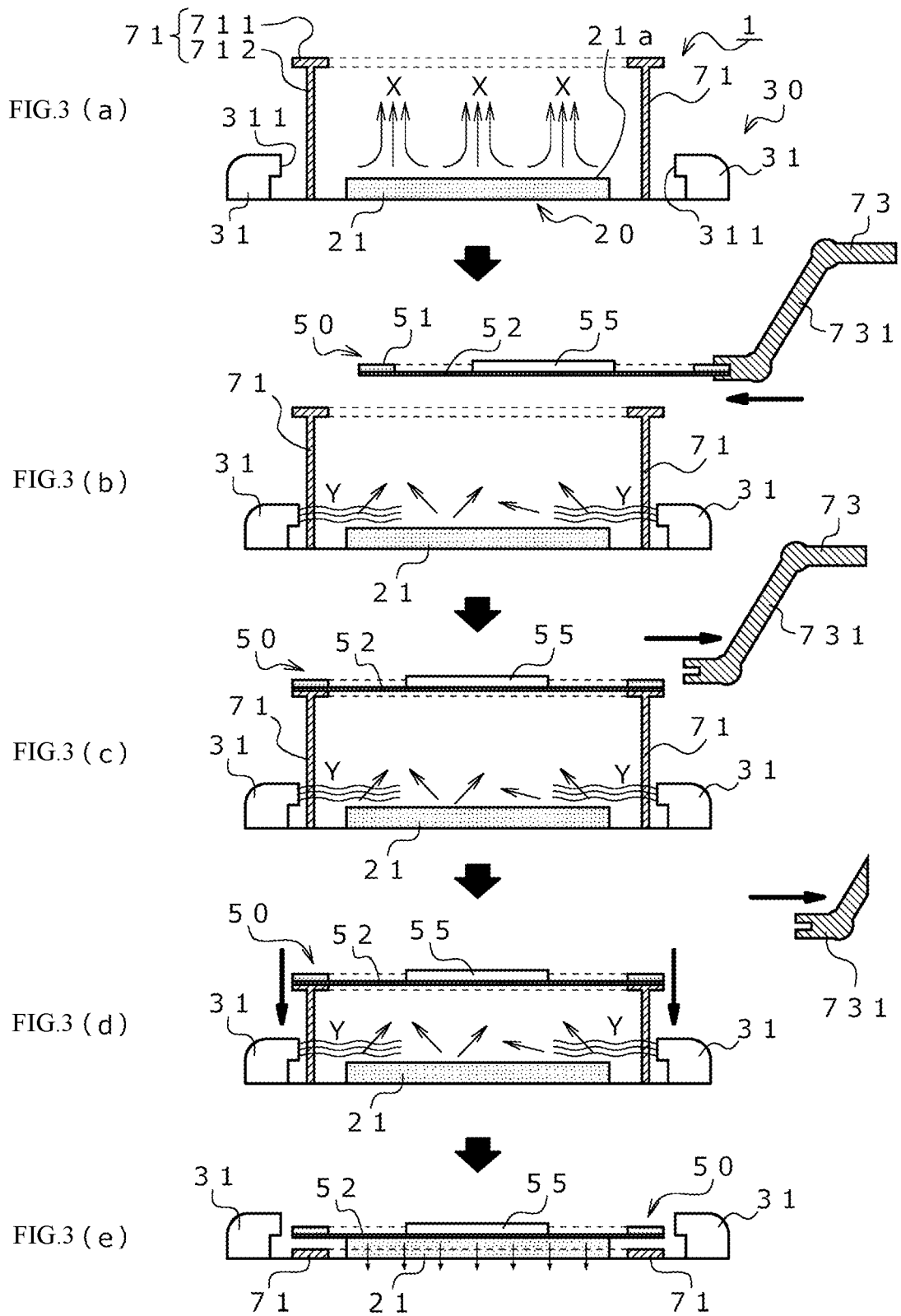

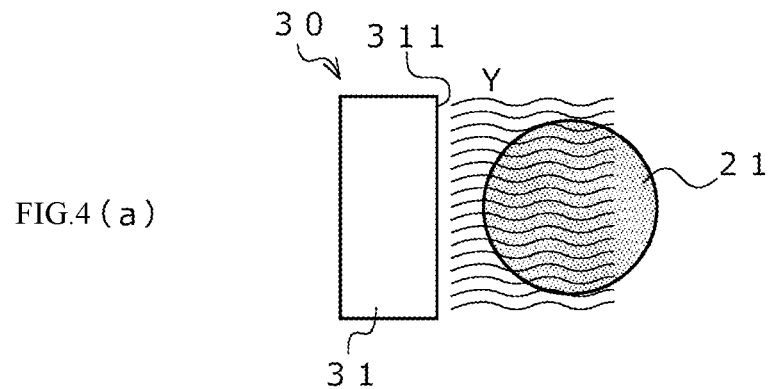
FIG.4 ( a )
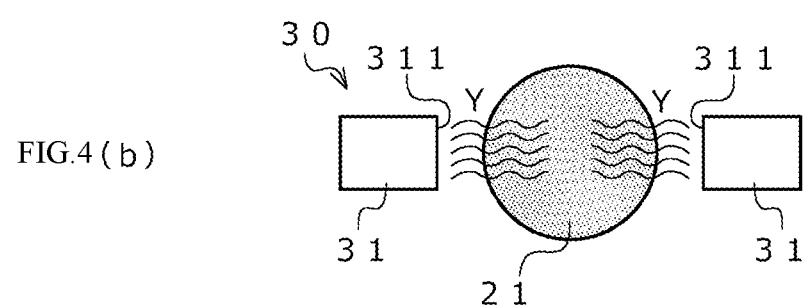
FIG.4 ( b )
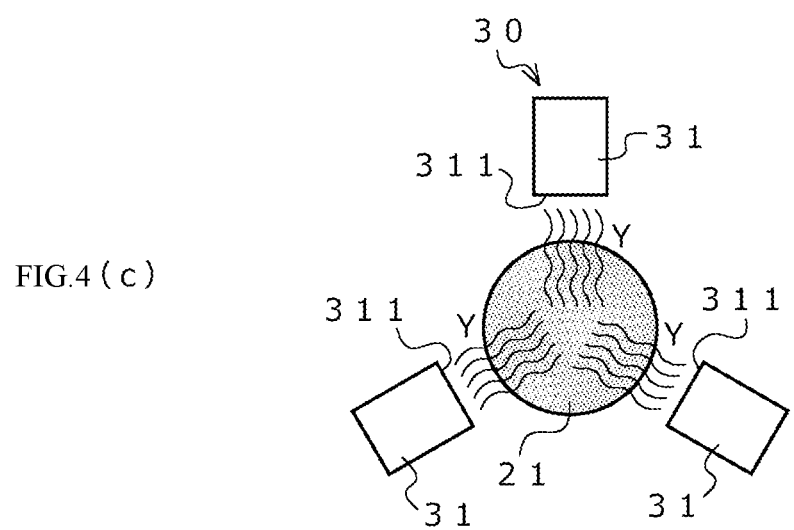
FIG.4 ( c )

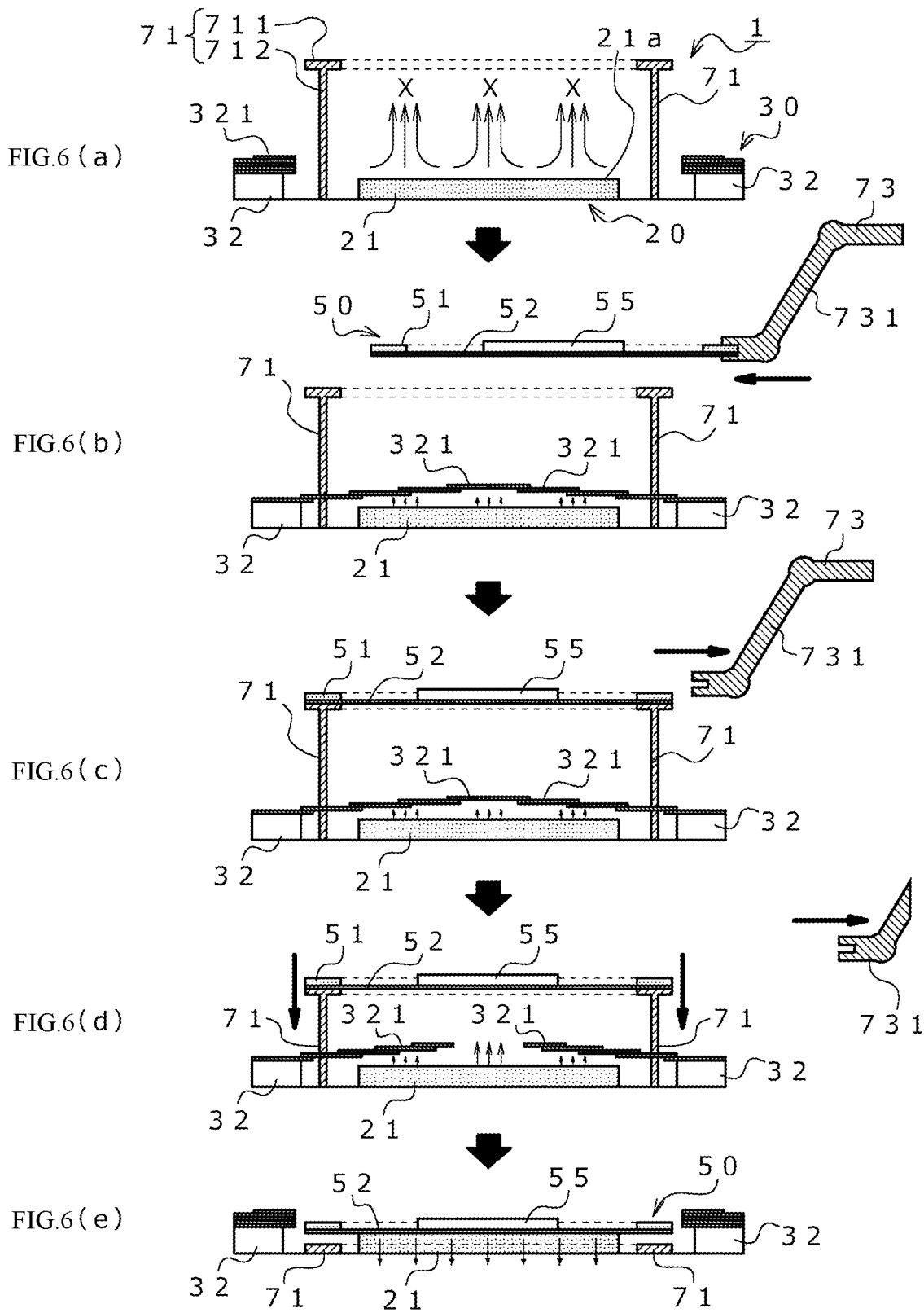

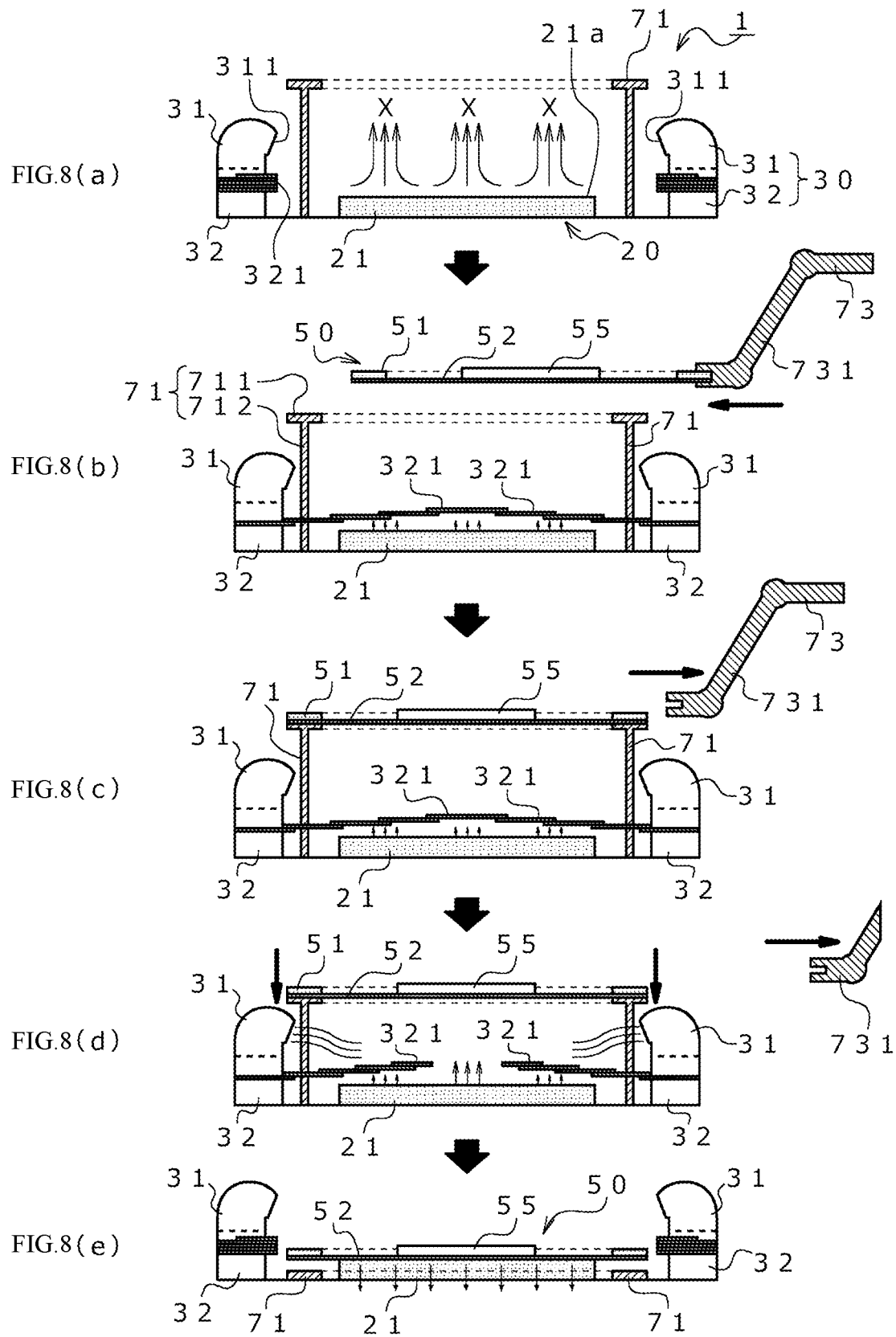

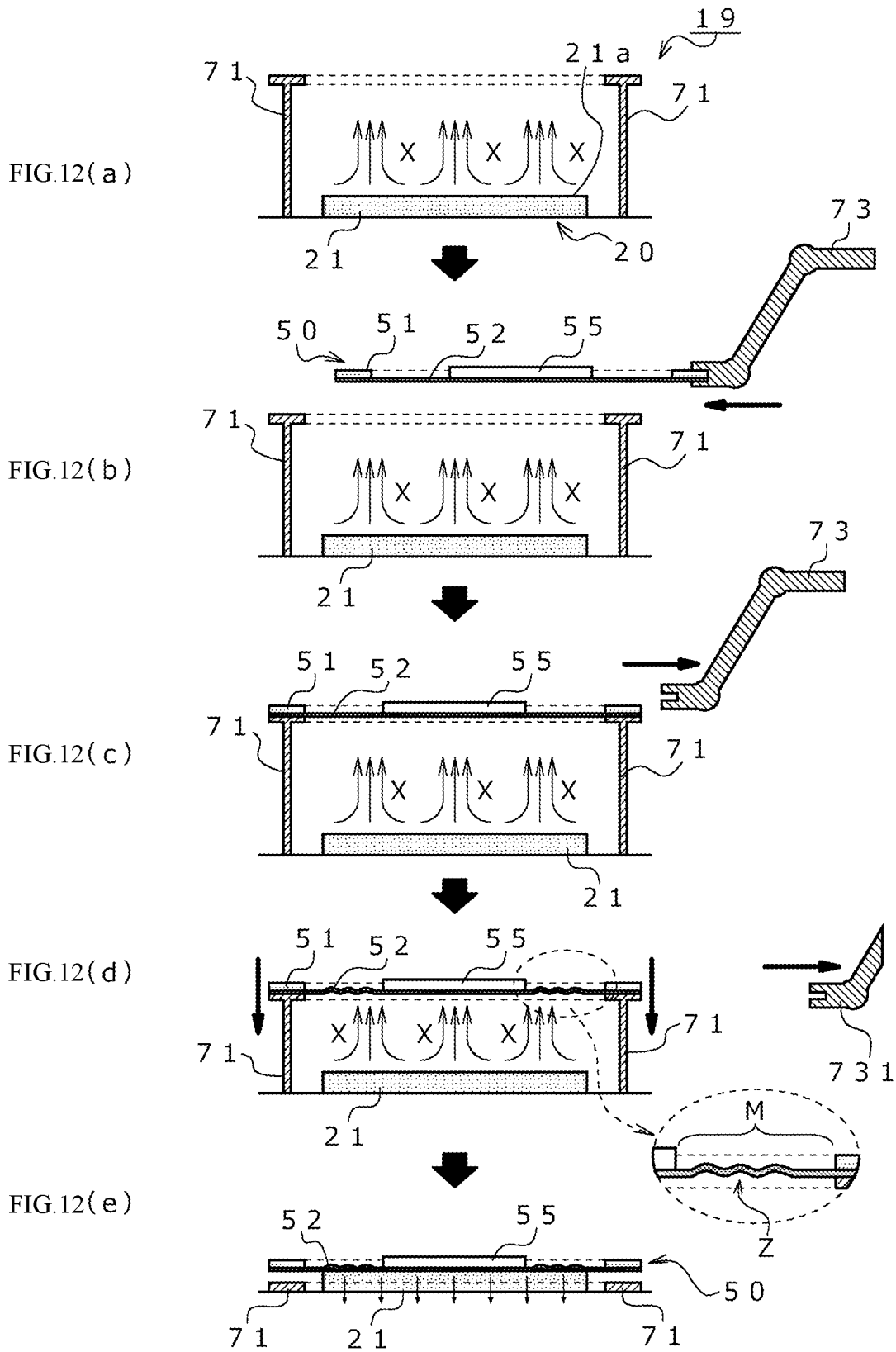

COMPONENT MANUFACTURING DEVICE AND COMPONENT MANUFACTURING METHOD

TECHNICAL FIELD

The present invention relates to a component manufacturing apparatus and a component manufacturing method. More in detail, the present invention relates to a component manufacturing apparatus for manufacturing semiconductor components, a component manufacturing apparatus for manufacturing electronic components, a component manufacturing method for manufacturing semiconductor components, and a component manufacturing method for manufacturing electronic components.

BACKGROUND ART

When semiconductor components or electronic components are manufactured, a method may be adopted, in which evaluation (inspection) is performed after necessary steps, so that only the components that have passed the evaluation are sent to the subsequent step. According to this method, a waste of manufacturing can be eliminated in an early step, so that a yield of the final products rate can be improved. The outline is disclosed, for example, in Patent Literature 1 below (see FIGS. 3A to 3H, [0027] to [0030]). A problem of a component holding film to be used as a carrier, occurring in the above evaluation step of this method, is disclosed in Patent Literature 2 below.

CITATIONS LIST

Patent Literature

Patent Literature 1: JP 2006-287235 A
Patent Literature 2: JP 2016-142649 A

SUMMARY OF INVENTION

Technical Problems

In Patent Literature 2, a problem is pointed out, in which: when the component holding film (PET) is heated in the state of being mounted on the mounting surface of a hot plate, the film is heat-stretched, so that an inspection object is shifted from an inspection measurement position (Patent Literature 2 [0006]). And, as a solution to the problem, a method is proposed, in which after the film is heat-stretched in advance, the film is cooled and shrunk. That is, due to the previous heat-stretching, the film is brought into the state of not being further stretched in inspection heating, whereby the film can be normally chucked and fixed to a chuck table.

This method is an excellent technique for a material having a larger shrinkage rate than a stretching rate, but has the problem that it cannot be applied to a film not having such a property. PET, which is a material typically having a larger shrinkage rate than a stretching rate and is described in Patent Literature 2, is originally poor in flexibility, and its flexibility is further lost due to stretching and shrinkage. Therefore, there is the problem that among other steps requiring flexibility of a component holding film, it becomes difficult to share the film. That is, a problem occurs, in which when a component holding film is subjected to stretching and shrinkage, the possibility that the same component holding film can be shared among other steps is decreased.

From such a viewpoint, it is required that a problem, occurring when a component holding film is chucked and fixed to a chuck table in a heated state, can be solved by a further different method.

The present invention has been made in view of the above circumstances, and an object of the present invention is to provide a component manufacturing apparatus and a component manufacturing method that can normally chuck and fix a component holding film to a chuck table in a heated state with the use of an unprecedented method.

Solutions to Problems

That is, the present invention is as follows.

[1] A component manufacturing apparatus including a chucking and fixing means that chucks and fixes a component holding film to a heated surface of a chuck table, in which:
a component to be held to the film is a component selected from a semiconductor component, a precursor of the semiconductor component, an electronic component, and a precursor of the electronic component; and
the apparatus includes a preventing means that prevents heat convection, occurring on the surface of the chuck table, from contacting the film to which the component is held.

[2] The component manufacturing apparatus according to [1], in which the preventing means is a means that blows gas.

[3] The component manufacturing apparatus according to [1] or [2], in which the preventing means is a means that interposes a blocking member between the surface of the chuck table and the film.

[4] The component manufacturing apparatus according to any one of [1] to [3], wherein the apparatus includes a transport means, and
the transport means is a means that lowers the film maintained approximately horizontally toward the surface of the chuck table, or a means that raises the surface of the chuck table toward the film maintained approximately horizontally.

[5] A component manufacturing method including a setting step of chucking and fixing a component holding film to a heated surface of a chuck table, in which:
a component to be held to the film is a component selected from a semiconductor component, a precursor of the semiconductor component, an electronic component, and a precursor of the electronic component; and
the setting step includes a preventing step of preventing heat convection, occurring on the surface of the chuck table, from contacting the film to which the component is held.

[6] The component manufacturing method according to [5], in which the preventing step is a step of blowing gas.

[7] The component manufacturing method according to [5] or [6], in which the preventing means is a step of interposing a blocking member between the surface of the chuck table and the film.

[8] The component manufacturing method according to any one of [5] to [7], in which: the setting step includes a transport step; and
the transport step is a step of lowering the film maintained approximately horizontally toward the surface of the chuck table, or a step of raising the surface of the chuck table toward the film maintained approximately horizontally.

[9] The component manufacturing method according to any one of [5] to [8], in which: the film includes a holding layer that holds the component and a base layer that supports the holding layer; and a linear thermal expansion coefficient of the base layer is 100 ppm/K or more.

[10] The component manufacturing method according to any one of [5] to [9], in which a ratio $R_{E1}$ (=E'(160)/E'(25)) of an elastic modulus at 160° C. of the base layer to an elastic modulus at 25° C. of the base layer is 0.2 or less, and E'(25) is 400 MPa or less.

Advantageous Effects of Invention

According to the present component manufacturing apparatus, a component holding film can be chucked and fixed to a chuck table in a heated state by an unprecedented method. That is, a component holding film can be chucked and fixed to a heated surface of a chuck table by using a preventing means that can prevent heat convection.

When the preventing means is a means for blowing gas in the present component manufacturing apparatus, heat convection can be destroyed by blowing gas, whereby heat convection can be prevented from contacting the component holding film. In the preventing of heat convection by blowing gas, it is unnecessary to interpose an object between the component holding film and the chuck table in order to prevent heat convection. Therefore, a mechanical mechanism for interposing an object and removing the object is not required, and a time for operating the mechanical mechanism is also not required. Therefore, heat convection can be surely prevented from when the chuck table and the component holding film start facing each other to when they are about to contact each other. Further, a mechanical mechanism for interposing and removing an object is not required, and hence the present component manufacturing apparatus can be configured to have a simple device configuration.

When the preventing means is a means for interposing a blocking member between the surface of the chuck table and the component holding film in the present component manufacturing apparatus, heat convection can be prevented by interposition of the blocking member, whereby heat convection can be prevented from contacting the component holding film. Furthermore, heat dissipation from the chucking surface by heat convection is blocked by the blocking member, and hence an unintentional decrease in the temperature of the chucking surface can be suppressed, whereby energy cost to be required for managing the temperature of the chuck table can be reduced.

When including a transport means that lowers the component holding film maintained approximately horizontally toward the surface of the chuck table, or a transport means that raises the surface of the chuck table toward the component holding film maintained approximately horizontally, a component manufacturing apparatus is configured to have a mechanical configuration in which since the component holding film and the chuck table are transported while facing each other, a time, during which heat convection is contacting the component holding film, becomes longer during the transport. With respect to this point, the present component manufacturing apparatus has the preventing means, so that heat convection can be surely prevented during the above transport, whereby effects of preventing heat convection can be obtained more remarkably.

According to the present component manufacturing method, the component holding film can be chucked and fixed to the chuck table in a heated state by an unprecedented method. That is, the component holding film can also be chucked and fixed to a heated surface of the chuck table by including a preventing step of preventing heat convection.

When the preventing step is a step of blowing gas in the present component manufacturing method, heat convection can be destroyed by blowing gas, whereby heat convection can be prevented from contacting the component holding film. Since heat convection is prevented by blowing gas, it is unnecessary to interpose an object between the component holding film and the chuck table in order to prevent heat convection. Therefore, a mechanical mechanism for interposing and removing an object is not required, and a time for operating the mechanical mechanism is also not required. Therefore, heat convection can be surely prevented from when the chuck table and the component holding film start facing each other to when they are about to contact each other. Further, a mechanical mechanism for interposing and removing an object is not required, and hence a component manufacturing apparatus using the present method can be configured to have a simple device configuration.

When the preventing step is a step of interposing a blocking member between the surface of the chuck table and the component holding film in the present component manufacturing method, heat convection can be prevented by interposition of the blocking member, whereby heat convection can be prevented from contacting the component holding film. Furthermore, heat dissipation from the chucking surface by heat convection is blocked by the blocking member, and hence an unintentional decrease in the temperature of the chucking surface can be suppressed, whereby energy cost to be required for managing the temperature of the chuck table can be reduced.

When the present component manufacturing method includes a transport step of lowering the component holding film maintained approximately horizontally toward the surface of the chuck table, or a transport step of raising the surface of the chuck table toward the component holding film maintained approximately horizontally, the component holding film and the chuck table are transported to face each other, and hence a time, during which heat convection is contacting the component holding film, becomes longer during the transport. With respect to this point, the present component manufacturing method includes the preventing step, so that heat convection can be surely prevented during the above transport, whereby effects of preventing heat convection can be obtained more remarkably.

BRIEF DESCRIPTION OF DRAWINGS

FIG. 3 is an explanatory view for explaining operations when a gas blowing means is used in the present component manufacturing apparatus.

FIG. 4 is an explanatory view illustrating a variation of a gas blowing means that can be used in the present component manufacturing apparatus.

FIG. 6 is an explanatory view for explaining operations when a blocking means is used in the present component manufacturing apparatus.

FIG. 8 is an explanatory view for explaining operations when a gas blowing means and a blocking means are used in combination in the present component manufacturing apparatus.

FIG. 12 is an explanatory view for explaining a problem of a conventional component manufacturing apparatus.

DESCRIPTION OF EMBODIMENTS

Figure 1:
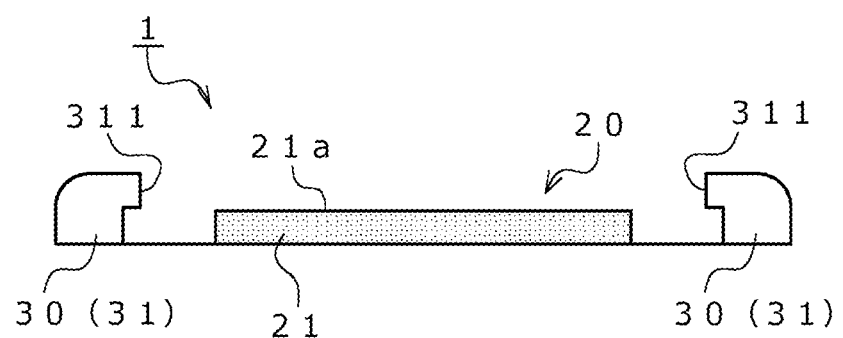
FIG. 1 is an explanatory view illustrating one example of the present component manufacturing apparatus.

Hereinafter, the present invention will be described with reference to the drawings. Matters indicated herein are illustrative and for illustratively explaining embodiments of the present invention, and are described for the purpose of providing explanation that seems to be most effective and easiest for understanding of the principle and conceptual features of the present invention. In this respect, it is not intended to present the structural details of the present invention to a certain degree or more necessary for fundamental understanding of the present invention, and it is intended to clearly teach those skilled in the art how some forms of the present invention are actually embodied by using explanation in combination with the drawings.

[1] Component Manufacturing Apparatus

The present component manufacturing apparatus (1) is an apparatus (1) that manufactures a component (55) selected from a semiconductor component, a precursor of the semiconductor component, an electronic component, and a precursor of the electronic component, and includes a chucking and fixing means (20) and a preventing means (30).

When the temperature of a surface of a chuck table (hereinafter, also simply referred to as a chucking surface) is room temperature in chucking a component holding film, the component holding film can be generally chucked and fixed without causing a chucking leak. And, after the normal chucking, the normal chucking state may be maintained even if the temperature of the chucking surface is raised.

However, the raise and lowering of the temperature of the chucking surface are not preferable from the viewpoints of an efficient evaluation step and energy saving. That is, an operation of an apparatus so as to maintain a change in the temperature of the chucking surface to be small is preferable from the viewpoints of an efficient evaluation step and energy saving. Therefore, it is preferable that the component holding film can be chucked to the chucking surface heated in advance. However, it has been found that when even a component holding film, which can be maintained in a normal chucked state when heated after being chucked at room temperature, is tried to be chucked to a chucking surface heated in advance, a chucking failure may occur.

As a result of focusing on this chucking failure and studying its details, the present inventor has found that before a component holding film 52 contacts a chucking surface 21a of a chuck table 21, a wrinkle Z (see FIG. 12d) occurs in a periphery M of a component 55 that is held. And, it has been turned out that a phenomenon, in which a chucking leak is caused (see FIG. 12e) with the wrinkle Z reaching the chucking surface 21a without being stretched, occurs.

From this, the present inventor has thought that the above wrinkle may occur with the component holding film thermally expanded by indirect heating even in a state of being separated from the chucking surface. And, the present inventor has studied how to prevent the component holding film from being indirectly heated from the chucking surface. Herein, it is considered that the above indirect heating includes at least heating by heat convection and heating by infrared rays, but methods of preventing the respective heating are different from each other. With respect this point, the present inventor has thought that since constituent materials of the component holding film are mostly infrared transmissive materials, so that the component holding film is affected more directly by heat convection. Therefore, it has been known that when the component holding film is chucked to the heated chucking surface while heat convection is being prevented, occurrence of the above wrinkle can be prevented, whereby the component holding film can be normally chucked. The present invention has been completed based on this result.

Figure 2:
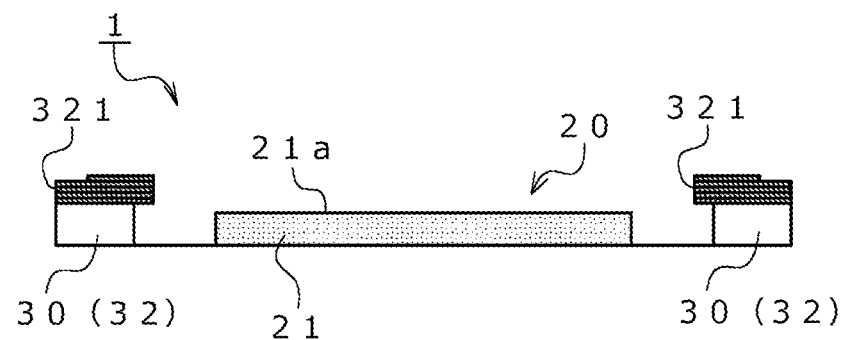
FIG. 2 is an explanatory view illustrating another example of the present component manufacturing apparatus.

Therefore, the present component manufacturing apparatus (1) includes: a chucking and fixing means (20) that chucks and fixes a component holding film (52) to a heated surface (21a) of a chuck table (21); and a preventing means (30) that prevents heat convection (X), occurring on the surface (21a), from contacting the component holding film (52) when the component holding film (52) is chucked to the surface (21)a of the chuck table (21) (see FIGS. 1 and 2).

The "component holding film (52)" is a film for holding the component 55. The component holding film 52 usually has a base layer 521 and a holding layer 522 provided on at least one surface of the base layer 521 (see FIGS. 9 and 10). The base layer 521 is a layer that supports the holding layer 522, and usually governs a shape, heat resistance, stiffness, flexibility, and the like of the whole component holding film 52. A material that constitutes the base layer 521, and the like will be described later.

Figure 9:
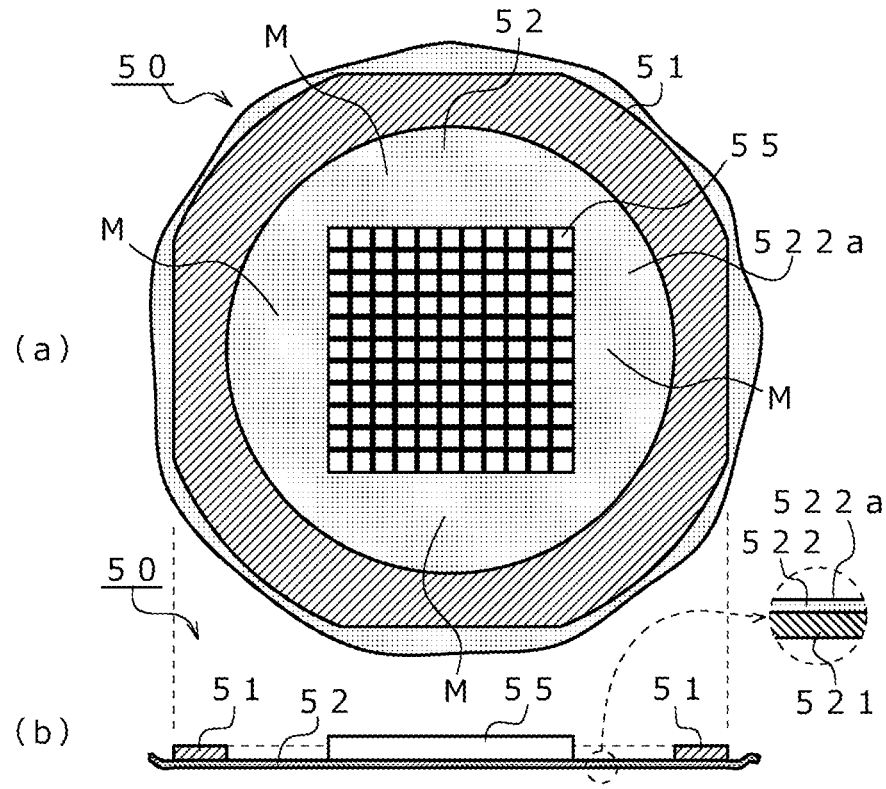
FIG. 9 is an explanatory view illustrating one example of a component holding film and a component holding tool.
Figure 10:
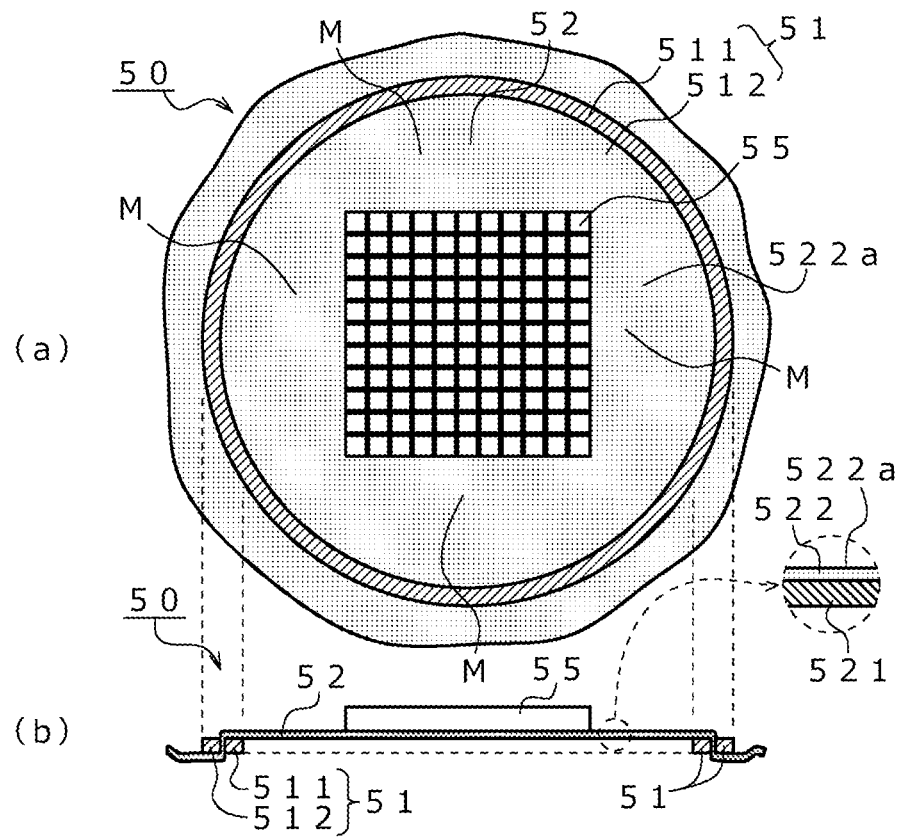
FIG. 10 is an explanatory view illustrating another example of a component holding film and a component holding tool.

The component holding film 52 is usually used in a state of being stretched on a frame body 51 (see FIGS. 9 and 10). Specifically, the component holding film 52 is used in: a component holding tool 50 (see FIG. 9) in which the component holding film 52 is stretched by causing the holding layer 522 of the component holding film 52 to adhere to the plate-shaped frame body 51 (a ring frame or the like); a component holding tool 50 (see FIG. 10) in which the component holding film 52 is stretched by being sandwiched in a gap of a frame body 51 (a grip ring or the like) including an inner frame 511, an outer frame 512, and the like that can be engaged with each other; or the like. That is, the component holding tool 50 can be usually composed of the frame body 51 and the component holding film 52.

Such a component holding tool 50 is used in a state of holding the components 55 to a holding surface 522a (an outer surface of the holding layer 522) of the component holding film 52, for example, in a state in which a plurality of the components 50 are housed in a cassette case.

Arrangement of the base layer 521 and the holding layer 522 in FIGS. 9 and 10 is one example. For example, FIG. 9 illustrates a form in which the holding layer 522 is arranged to be exposed inside the frame body 51, but the holding layer 522 can be exposed outside the frame body 51 by using a component holding film 52 having the holding layers 522 on both surfaces of the base layer 521. On the other hand, FIG. 10 illustrates a form in which the holding layer 522 is arranged to be exposed outside the inner frame 511, but the holding layer 522 can be exposed inside the inner frame 511 by changing the way of sandwiching or changing places of the front and back surfaces of the component holding film 52.

The "component (55)" is a component selected from a semiconductor component, a precursor of the semiconductor component, an electronic component, and a precursor of the electronic component. Any of these components 55 may or may not be divided. That is, the components 55 include a semiconductor wafer, a precursor of a semiconductor component divided from the semiconductor wafer, and a semiconductor component made by subjecting the precursor of a semiconductor component to predetermined steps (e.g., an evaluation step, and the like). Similarly, the components 55 include an array-shaped electronic component, a precursor of an electronic component divided from the array-shaped electronic component, and an electronic component made by subjecting the precursor of an electronic component to predetermined steps (e.g., the evaluation step, and the like).

The component manufacturing apparatus 1 (further, the same also applies to the component manufacturing method described later) of the present invention can be suitably used for, of the above components, the array-shaped electronic component, the precursor of an electronic component, and the electronic component, and can be suitably used for, above all, the array-shaped electronic component.

Of the above components, the array-shaped electronic component is a component in which the precursors of electronic components are integrated into an array shape, and includes the following forms (1) to (3).

(1): An array-shaped electronic component obtained by: arraying, on a lead frame, semiconductor components (chips, dies) obtained from a semiconductor wafer on which circuits are formed; wire-bonding them; and then sealing them with a sealant.

(2): An array-shaped electronic component obtained by: separately arraying semiconductor components (chips, dies) obtained from a semiconductor wafer on which circuits are formed; sealing them with a sealant; and then collectively forming external circuits for obtaining conduction with the outside, such as a rewiring layer and a bump electrode. That is, an array-shaped electronic component obtained in a fan-out method (eWLB method).

(3): An array-shaped electronic component obtained by using a semiconductor wafer in a wafer state as it is; and collectively forming external circuits for obtaining conduction with the outside, such as a rewiring layer and a bump electrode, and a sealed layer sealed with a sealant. The semiconductor wafer in the form (3) includes: a form in a state before being divided, where semiconductor components (chips, dies) are formed in an array shape; a form where the semiconductor wafer is used as a substrate (a form where a chip having circuits is joined onto a non-circuit silicon substrate to be used); and the like. That is, the array-shaped electronic component in the form (3) is an array-shaped electronic component obtained in a wafer-level chip size package (WLCSP) method.

Of these, the array-shaped electronic components 55 of the forms (1) and (2) are mostly formed into an approximately rectangular shape, as illustrated in FIGS. 9 and 10, and in the case of the component holding tool 50 using one of the various frame bodies 51 having an approximately circular opening, a region M (a region around a component) that the component 55 does not contact occurs on the component holding film 52, so that the above components 55 are likely to cause the wrinkle Z in the region M.

On the other hand, the array-shaped electronic components 55 of the form (3) are mostly formed into an approximately circular shape, and its area becomes smaller than those of the array-shaped electronic components 55 of the forms (1) and (2), but similarly a region M (a region around a component) that the component 55 does not contact occurs on the component holding film 52, so that the above components 55 are likely to cause the wrinkle Z in the region M.

The "chucking and fixing means (20)" is a means that chucks and fixes the component holding film 52 to the chucking surface 21*a*, as described above, and specifically, it is a means that can fix the component 55 to the chuck table 21 by chucking the component holding film 52 in a state of holding the component 55 to the heated chucking surface 21*a*. The specific temperature of the heated chucking surface 21*a* is not limited, but it can be set to be, for example, 50° C. or higher and 200° C. or lower. The temperature can further be set to be 80° C. or higher and 180° C. or lower, and further be set to be 90° C. or higher and 160° C. or lower. On the other hand, the "room temperature" is 18° C. or higher and 28° C. or lower in the present invention.

The configuration of the chucking and fixing means 20 is not limited, except that it has the chuck table 21.

The chuck table 21 has the above chucking surface 21*a*. The chucking surface 21*a* is usually flat as a whole. Also, the chucking surface 21*a* includes chucking holes and/or chucking grooves for chucking. These chucking holes and/or chucking grooves are connected to a chucking source, such as a vacuum pump, via required paths, whereby a chucking action can be exerted.

A top face of a molded body is usually used as the chucking surface 21*a*. As the molded body, a porous molded body, a molded body including chucking routes such as chucking holes and chucking grooves, or the like can be used. These molded bodies are usually used in a plate shape.

Also, the molded body includes a heater that is integrated with the molded body (integrated by being arranged on one surface of the molded body, integrated by being arranged inside the molded body), or a heater that is separated from the molded body. By including the heater, the chucking surface 21*a* can be heated. Of course, the molded body can include a sensor and a control mechanism for controlling the heater.

These chucking source, molded body for providing the chucking surface, the heater, and the like have been described as the constituents of the chuck table 21, but what they belong to is not limited to this, and they may be constituents included in the chucking and fixing means 20.

The "preventing means (30)" is a means that prevents heat convection X, occurring on the surface 21*a* of the chuck table 21, from contacting the component holding film 52, when the component holding film 52, to which the component 55 is held, is chucked to the surface 21*a* of the chuck table 21. The preventing means 30 is only required to prevent the heat convection X from contacting the component holding film 52, and its mechanism and configuration are not limited. As described later, examples of the preventing means 30 include a gas blowing means 31 (a means for blowing gas), a blocking means 32 (a means for interposing a blocking member), a chucking means (a means for chucking), and the like. These means may be used alone or in combination of two or more.

The "gas blowing means (31)" is a means that blows gas to prevent the heat convection X from contacting the component holding film 52 (see FIGS. 1, and 3 to 5). That is, the heat convection X can be destroyed by wind Y sent out from the gas blowing means 31. By the destruction of the heat convection X, the heat convection X can be prevented from contacting the component holding film 52.

The heat convection X is a gas current that moves from the chucking surface 21*a* toward the component holding film 52 arranged thereabove, and is a gas current hotter than the periphery of the chucking surface 21*a*. The gas current includes at least an ascending gas current that moves from the chucking surface 21*a* toward the component holding film 52, and it may further include a descending gas current so as to form a Benard vortex. The destruction of the heat convection X means that at least the formation of the above ascending gas current can be prevented. The preventing of the formation of the ascending gas current may be performed: by blowing gas to a region where an ascending gas current is likely to be formed; by blowing gas to contact the chucking surface 21*a*; and further by another form of blowing gas, as far as the above preventing can be performed as a result.

In the preventing of heat convection by the gas blowing means 31, it is unnecessary to interpose an object (a blocking member 321 described later, or the like) between the component holding film 52 and the chuck table 21 in order to prevent the heat convection X, as described above. Therefore, a mechanical mechanism for interposing an object and removing the object is not required, and a time for operating the mechanical mechanism is also not required. Therefore, heat convection can be surely prevented from when the chuck table 21 and the component holding film 52 start facing each other to when they are about to contact each other. Further, a mechanical mechanism for interposing and removing an object is not required, and hence the component manufacturing apparatus 1 can be configured to have a simpler configuration.

The present component manufacturing apparatus 1 may include only one gas blowing means 31 or two or more of them. The gas blowing means 31 can have, for example, a wind forming part (not illustrated) that forms the wind Y, a guide path that guides the formed wind Y to a sending part 311, the sending part 311 that sends out the wind Y, and the like. Each of them may be included in the gas blowing means 31 alone, or two or more of each of them may be included. Of these, a fan with swivelable wings, or the like, can be used as the wind forming part. The sending part 311 is a part that sends out the formed wind Y to a desired sending location.

Specifically, the heat convection X on the chuck table 21 can be destroyed, for example, by including one sending part 311 on one side of the chuck table 21, and by blowing gas from the one sending part 311 toward the other side (the side opposite to the one side) of the chuck table 21 (see FIG. 4*b*). Also, the heat convection X on the chuck table 21 can be destroyed by including one sending part 311 on each of one side and the other side (the side opposite to the one side) of the chuck table 21 (i.e., two sending parts 311 in total), and by blowing gas from the two sending parts 311 toward the center of the chuck table 21 (blowing gas so as to face each other) (see FIG. 4*b*). Further, the heat convection X on the chuck table 21 can be destroyed by including totally three sending parts 311 in three locations around the chuck table 21, and by blowing gas from the three sending parts 311 toward the center of the chuck table 21 (see FIG. 4*c*).

The gas blowing means 31 is only required to prevent heat convection by blowing gas, and may blow gas in any direction. For example, the gas blowing means 31 may: <1> blow gas such that wind directly contacts the heat convection X; or <2> blow gas indirectly such that the wind Y does not directly contact the heat convection X.

Figure 5A:
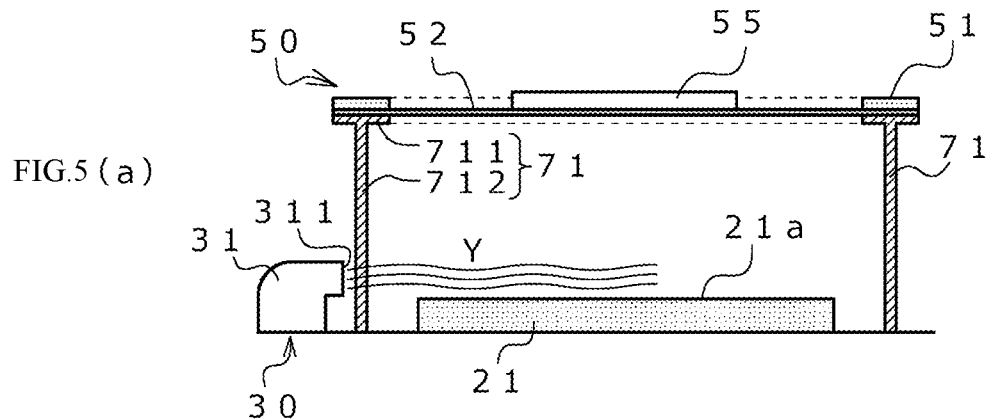
FIG. 5 is an explanatory view illustrating a variation of a gas blowing means that can be used in the present component manufacturing apparatus.
Figure 5B:
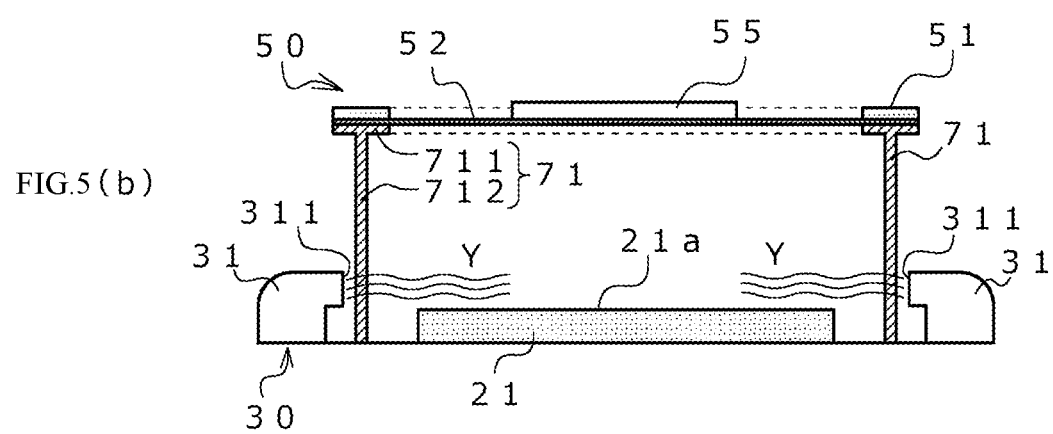
Figure 5C:
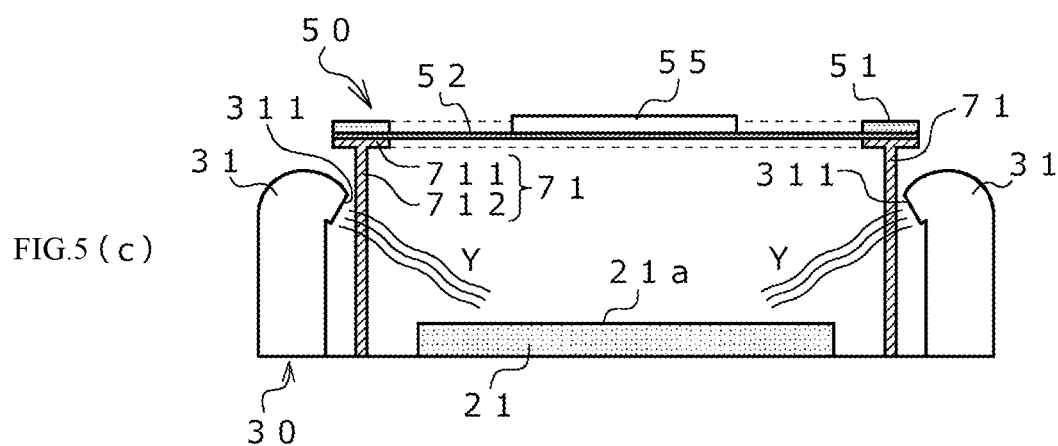

Of these, examples of the case <1> of blowing gas such that the wind Y directly contacts the heat convection X include, for example: a case <1-1> where the heat convection X is destroyed by blowing gas almost in parallel to the chucking surface 21*a* of the chuck table 21 (i.e., by forming the wind Y to be sent out almost in parallel to the chucking surface 21*a*) (see FIGS. 5*a* and 5*b*); and a case <1-2> where the heat convection X is destroyed by blowing gas such that counter-wind, in which the wind Y directly contacts the chucking surface 21*a* of the chuck table 21, is obtained (by forming the wind Y to be sent out from diagonally above the chucking surface 21*a* toward the chucking surface 21*a*) (see FIG. 5*c*).

On the other hand, an example of the case <2> of indirectly blowing gas such that wind does not directly contact heat convection includes a case <2-1> where heat convection is destroyed by forming a vortex by blowing gas to the periphery of the heat convection.

These gas blowing forms may be used alone or in combination of two or more. Of these gas blowing forms, <1-1> and/or <2-1> are/is more preferable than <1-2>. It is because unintentional cooling of the chucking surface can be suppressed more in the gas blowing forms of <1-1> and <2-1> than in the gas blowing form of <1-2>.

The temperature of the wind Y sent out from the gas blowing means 31 is not limited, and the temperature may or may not be adjusted. From the viewpoint of suppressing unintentional cooling of the chucking surface 21*a*, heated wind Y can also be sent out, but the temperature of the wind Y is usually lower than the surface temperature of the chucking surface 21*a*, and wind whose temperature is room temperature or higher than that is preferable.

Figure 7A:
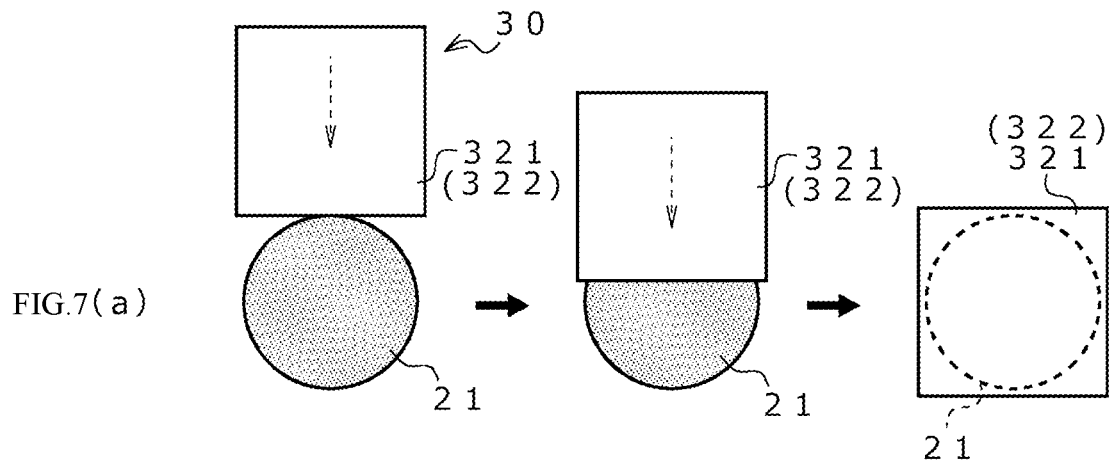
FIG. 7 is an explanatory view illustrating a variation of a blocking means that can be used in the present component manufacturing apparatus.
Figure 7B:
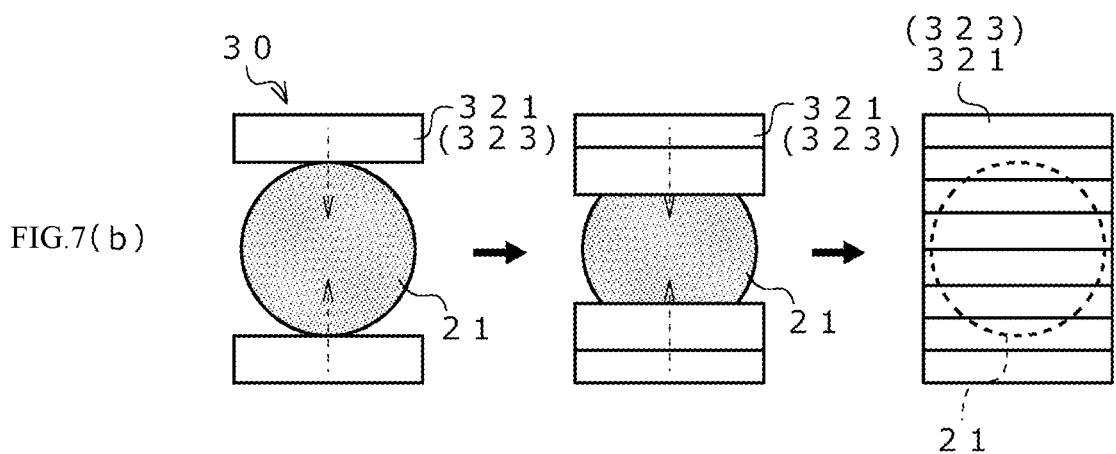

The "blocking means (32)" is a means that interposes the blocking member 321 between the component holding film 52 and the chuck table 21 in order to prevent the heat convection X from contacting the component holding film 52 (see FIGS. 2, 6, and 7). The blocking member 321 is usually interposed between the chucking surface 21*a* and the component holding film 52.

With the use of the blocking means 32, not only the heat convection X can be prevented from contacting the component holding film 52, but also cooling of the chuck table 21 can be suppressed by blocking, with the blocking member 321, heat dissipation from the chucking surface 21*a* by the heat convection X. Thereby, energy cost to be required for managing the temperature of the chuck table 21 can be reduced.

The present component manufacturing apparatus 1 may include only one blocking means 32 or two or more of them. The component manufacturing apparatus 1 is only required to exert the later-described action, and its configuration is not limited.

The blocking member 321 is a member to be interposed between the chucking surface 21*a* and the component holding film 52. The shape of the blocking member 321 is not limited, and can be, for example, a plate shape. By forming into a plate shape, the thickness of the blocking member 321 can be suppressed, whereby a gap between the chucking surface 21*a* and the component holding film 52 can be blocked, even if the gap is small. That is, the gap between the chucking surface 21*a* and the component holding film 52 can be blocked until both of them are about to contact each other.

The material that constitutes the blocking member 321 is not limited, and an inorganic material and/or an organic material can be appropriately used. Of these, an inorganic material is preferable from the viewpoint of heat resistance, and an organic material is preferable from the viewpoint of having a low thermal conductivity. Examples of the inorganic material include metals, ceramics, glass, and the like. These may be used alone or in combination of two or more.

Of these, metals and/or ceramics are preferable, and metals are particularly preferable from a viewpoint that they can be formed to be thin. Specific types of the metals are not limited, but a metal having a small thermal conductivity (e.g., 30 $W \cdot m^{-1} \cdot K^{-1}$ or less) is preferable, and examples of the metal include, for example, stainless steel, iron, various iron alloys (nickel steel, nichrome steel, and the like), nickel chrome alloy, and the like. Examples of the organic material include various resins having a melting point of 150° C. or higher. When a material having a low thermal conductivity is used for the blocking member 321, not only the heat convection X can be blocked from contacting the component holding film 52, but also the heat dissipation from the chucking surface 21a can be suppressed more effectively. When a material (e.g., a metal) that prevents infrared transmission is used for the blocking member 321, infrared rays can also be blocked.

The specific mechanism of the blocking means 32 is not limited. For example, by using a blocking member 322 made of a single plate that can cover the chucking surface 21a of the chuck table 21, the chucking surface 21a of the chuck table 21 can be covered (see FIG. 7a).

The blocking member 321 can be formed of a single plate, as described above, but can also be formed of a plurality of plates that are divided. That is, by using a blocking member 323 made of a plurality of plates, the chucking surface 21a of the chuck table 21 can be covered with the blocking member 323 made of a plurality of the plates (see FIGS. 7b and 7c). When the blocking member 323 made of a plurality of plates is used, as described above, opening and closing time can be shortened, compared to the case of using the blocking member 322 made of a single plate. That is, a time from the start of covering with the blocking member 323 to the end of the covering, and a time from the start of housing of the blocking member 323 to the end of the housing, can be shortened, whereby a time, during which the heat convection X is contacting the component holding film 52, can be further shortened.

Figure 7C:
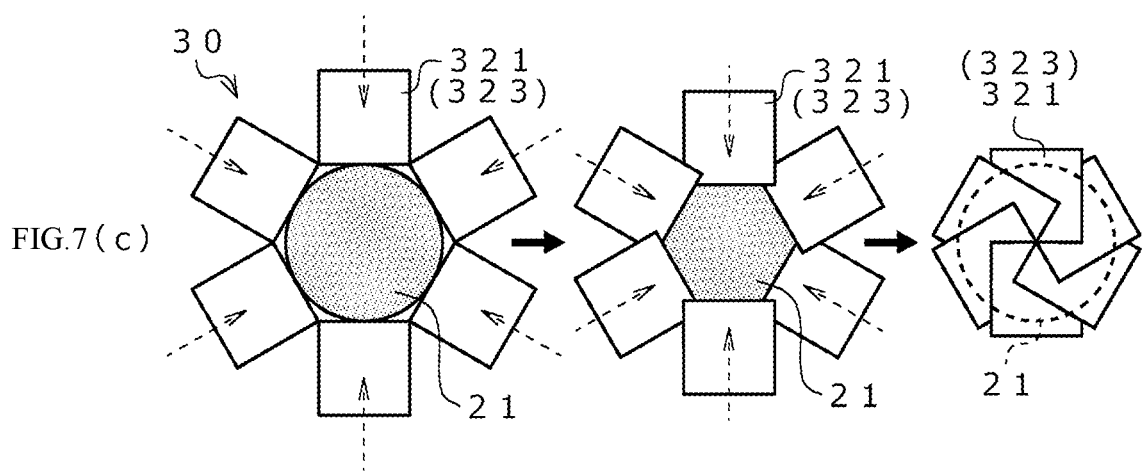

Further, when the blocking member 323 made of a plurality of plates is used, a direction in which each blocking member 323 is operated, may be a uniaxial direction (FIG. 7b) or a multi-axial direction (FIG. 7c). That is, an example of the form of operating in a uniaxial direction includes a shutter operation of a louver door system. For the form of operating in multi-axial directions, a lens shutter mechanism, and the like, to be used in optical equipment (camera, and the like) can be utilized.

As the preventing means 30, another means, besides the above gas blowing means 31 and blocking means 32, can be used. An example of the other preventing means 30 includes a chucking means. The chucking means is a means that performs chucking in which wind is formed by chucking and heat convection is destroyed by the wind. As the chucking means, a separate chucking means may be used, or a chucking mechanism in the chuck table 21 may be used. When the gas blowing means 31 and the chucking means are arranged to face each other, the wind sent out from the gas blowing means 31 can be drawn by the chucking means, whereby a gas blowing route can be formed more positively on the chucking surface 21a.

As described above, examples of the preventing means 30 include the gas blowing means 31, the blocking means 32, the chucking means, and the like, and they may be used alone or in combination. An example of the combined use form includes, for example, combined use of the gas blowing means 31 and the blocking means 32 (see FIG. 8). When used in combination in this way, the gas blowing means 31 and the blocking means 32 are allowed to function more effectively by making up for their respective weaknesses.

That is, the gas blowing means 31 has a weakness that the chucking surface 21a is gas-cooled by gas blowing, while it has merits that it can destroy the heat convection X and that it does not have a portion to be moved on the chucking surface 21a. On the other hand, the blocking means 32 has weaknesses that it takes time to move and retract a movable portion and that the heat convection X cannot be completely prevented from contacting the component holding film 52, while it has a merit that the chucking surface 21a can be rather kept warm by interrupting and preventing the heat convection X.

With respect to this point, when used in combination, the gas blowing means 31 and the blocking means 32 are allowed to function more effectively by making up for their respective weaknesses, as illustrated in FIG. 8. That is, the heat convection X may occur before the component holding film 52 is set in a first transport means 71 (see FIG. 8a). Then, when the component holding film 52 is set in the first transport means 71 by using a second transport means 73, the heat convection X can be blocked in advance by using the blocking means 32 (see FIG. 8b). Then, while an arm 731 is retracting after the setting is completed, the heat convection X can also continue to be blocked by using the blocking means 32 (see FIG. 8c). Further, when a transport rail 712 is lowered, the blocking member 321 is retracted such that the blocking member 321 and the component holding film 52 do not contact each other, and at the time, the heat convection X can be destroyed by blowing gas with the use of the gas blowing means 31 (see FIG. 8d). In this way, chucking and fixation can be achieved (see FIG. 8e).

Therefore, with the above combined use and usage, the gas-cooling of the chucking surface 21a by the operation of the gas blowing means 31 can be reduced, and the heat convection X can also be prevented from temporarily contacting the component holding film 52, while the blocking member 321 is retracting.

The present component manufacturing apparatus 1 can include other means in addition to the chucking and fixing means 20 and the preventing means 30. An example of the other means includes a transport means. The transport means may be included alone or in combination of two or more.

That is, examples of the transport means include, for example: the transport means 71 that performs transport such that the chucking surface 21a and the component holding film 52 are brought close to each other (hereinafter, also simply referred to as a "first transport means"); the transport means 73 that transports the component holding film 52 to the first transport means 71 as the component holding tool 50 (see FIGS. 9 and 10) in which the component holding film 52 is stretched on the frame body 51 (hereinafter, also simply referred to as a "second transport means"); and the like.

The "transport means (71)" (the first transport means 71) is a means that brings the chucking surface 21a and the component holding film 52 close to each other by maintaining them approximately horizontally, so that they contacts each other (see FIGS. 3, 5, 6, and 8). Specifically, the first transport means 71 is: a means that lowers the component holding film 52 (part of the component holding tool 50) maintained approximately horizontally toward the chucking surface 21a; a means that raises the chucking surface 21a toward the component holding film 52 (part of the component holding tool 50) maintained approximately horizontally; or a means that performs both of the two. The means, which lowers the component holding film 52 (part of the component holding tool 50) toward the chucking surface 21a, is illustrated in each of FIGS. 3, 6, 8, and 12.

A component manufacturing apparatus 19 including the first transport means 71 has also been known before (see FIG. 12). However, the conventional component manufacturing apparatus 19 has a configuration in which: since it does not have the preventing means 30, a time, during which the heat convection X occurring from the chucking surface 21a is contacting the component holding film 52 during the transport, is long, so that the apparatus 19 is affected more strongly by the heat convection.

On the other hand, the present component manufacturing apparatus 1 includes the preventing means 30, whereby the heat convection X can continue to be prevented by the first transport means 71, even while the chucking surface 21a and the component holding film 52 are being brought close to each other in approximately horizontal states. In this sense, the present component manufacturing apparatus 1 having the first transport means 71 has a configuration in which an action, obtained when the preventing means 30 is included, can be obtained more effectively.

When the component holding tool 50 is set in the first transport means 71, a distance between the component holding film 52 and the chucking surface 21a (a distance of the shortest portion) is not limited; however, in the present component manufacturing apparatus 1, the distance is preferable to be 300 mm or less (usually 1 mm or more), more preferable to be 200 mm or less, furthermore preferable to be 100 mm or less, and particularly preferable to be 50 mm or less.

The first transport means 71 is only required to be capable of bringing the chucking surface 21a and the component holding film 52 close to each other in approximately horizontal states, and its configuration is not limited. Such a first transport means 71 can appropriately include, for example: a mounting table 711 on which the frame body 51 of the component holding tool 50 can be mounted; the transport rail 712 that brings the mounting table 711 and the chucking surface 21a close to each other while maintaining the two approximately horizontally; further a driving source that drive the transport rail; and the like.

The "transport means (73)" (the second transport means 73) is a means that transports the component holding film 52 to the first transport means 71 (see FIGS. 3, 5, 6, and 8). The component holding film 52 is usually transported to the first transport means 71, as part of the above component holding tool 50. Further, when the first transport means 71 has the mounting table 711, as described above, the frame body 51 of the component holding tool 50 can be transported to be mounted on the mounting table 711.

A component manufacturing apparatus having the second transport means 73 has also been known before (see FIG. 12). However, the conventional component manufacturing apparatus 19 has a configuration in which: since it does not have the preventing means 30, a time, during which heat convection occurring from the chucking surface 21a is contacting the component holding film 52 during the transport, is long, so that the apparatus 19 is affected more strongly by the heat convection. That is, when the component holding film 52 is set in the first transport means 71, it is necessary to retract the second transport means 73 (the arm 731 that constitutes the second transport means 73) to a position where it is not affected by the operation of the first transport means 71 after the setting. Therefore, a time necessary for the retraction of the arm 731 becomes a time during which the component holding film 52 is being exposed to the heat convection X.

On the other hand, the present component manufacturing apparatus 1 includes the preventing means 30, and hence the heat convection X can continue to be prevented from contacting the component holding film 52 while the arm 731 is retracting, whereby an influence of the heat convection X can be remarkably reduced. In this sense, the present component manufacturing apparatus 1 having the second transport means 73 has a configuration in which an operation, obtained when the preventing means 30 is included, can be obtained more effectively.

The second transport means 73 is only required to be capable of transporting the component holding film 52 to the first transport means 71, and its configuration is not limited. Such a second transport means 73 can appropriately include, for example: the arm 731 that transports the frame body 51 of the component holding tool 50 to the mounting table 711 of the first transport means 71; a driving source that drives the arm 731; and the like.

Of course, the above first transport means 71 and second transport means 73 are also allowed to function as transport means for returning the component holding film 52 (as the component holding tool 50), to which the components 55 are held, into the cassette case, after the components 55 are evaluated.

In addition, the present component manufacturing apparatus 1 can include various configurations for evaluating the component 55. Specifically, the apparatus 1 can include an evaluation means that evaluates components. Specifically, examples of the evaluation means include, for example: an electrical characteristics evaluation means (a plurality of probes, a probe card in which the probes are arranged, or the like) that evaluates electrical characteristics of the component 55; an appearance characteristics evaluation means (a non-contact optical evaluation means, or the like) that measures appearance characteristics of the component 55; and the like.

[2] Component Holding Film

As described above, the component holding film 52 is a film for holding the components 55, and it usually has the base layer 521 and the holding layer 522 (see FIGS. 9 and 10). Of these, the base layer 521 is preferable to have a linear thermal expansion coefficient of 100 ppm/K or more. That is, the component holding film 52, including the base layer 521 made of a material having a large linear thermal expansion coefficient, has a tendency in which a wrinkle is more likely to occur when the film 52 contacts the heat convection X. It is considered that such a large linear thermal expansion coefficient is a driving factor that causes a deformation of the component holding film 52 under a high temperature. Therefore, the present component manufacturing apparatus 1 and the later-described component manufacturing method can enjoy the operations of the present invention more effectively, when using the component holding film 52 including the base layer 521 having a linear thermal expansion coefficient of 100 ppm/K or more.

This linear thermal expansion coefficient is preferable to be 100 ppm/K or more and 300 ppm/K or less, further preferable to be 130 ppm/K or more and 280 ppm/K or less, furthermore preferable to be 150 ppm/K or more and 250 ppm/K or less, and furthermore preferable to be 165 ppm/K or more and 240 ppm/K or less. The linear thermal expansion coefficient is measured according to JIS K7197, and means a thermal expansion coefficient at a temperature between 50° C. and 200° C.

Further, it is preferable that a ratio $R_{E1}$ (=E'(160)/E' (25)) of an elastic modulus E'(160) at 160° C. of the base layer 521 to an elastic modulus E' (25) at 25° C. of the base layer 521 is 0.2 or less and E'(25) is 400 MPa or less. That is, a material having a relatively small elastic modulus at 25° C., although it is greatly different from an elastic modulus at 160° C., is preferable. The "E'(160)" represents a tensile elastic modulus (unit: MPa) at 160° C. of the base layer 521, and the "E'(25)" represents a tensile elastic modulus (unit: MPa) at 25° C. of the base layer 521.

As described above, the ratio $R_{E1}$ is preferable to be $R_{E1} \leq 0.2$. The lower limit of the ratio $R_{E1}$ is not limited, but it is usually $0.0001 \leq R_{E1}$. The ratio $R_{E1}$ is further preferable to be $0.0005 \leq R_{E1} \leq 0.19$, more preferable to be $0.001 \leq R_{E1} \leq 0.18$, further preferable to be $0.01 \leq R_{E1} \leq 0.17$, and particularly preferable to be $0.08 \leq R_{E1} \leq 0.16$.

When $R_{E1}$ is within the range of $R_{E2} \leq 0.2$, E'(25) is preferable to be E'(25)≤400 MPa. The lower limit of E'(25) is not limited, but it is usually 40 MPa≤E'(25). E'(25) is further preferable to be 42 MPa≤E'(25)≤350 MPa, more preferable to be 44 MPa≤E'(25)≤300 MPa, further preferable to be 46 MPa≤E'(25)≤250 MPa, and particularly preferable to be 48 MPa≤E'(25)≤200 MPa. The value of E'(25) in an MD direction of the base layer may be different from that in a TD direction of the base layer, but it is preferable that the values in both the directions fall within the above ranges.

On the other hand, E'(160) is not limited, but E'(160) is preferable to be 0.1 MPa≤E'(160)≤80 MPa, more preferable to be 0.15 MPa≤E' (160)≤70 MPa, further preferable to be 0.2 MPa≤E'(160)≤60 MPa, and particularly preferable to be 1 MPa≤E'(160)≤50 MPa. The value of E'(160) in the MD direction of the base layer may be different from that in the TD direction of the base layer, but it is preferable that the values in both the directions fall within the above ranges.

Each of the above elastic moduli E' is measured by a dynamic viscoelasticity measuring device (DMA: Dynamic Mechanical Analysis). Specifically, each elastic modulus E' can be obtained by reading data at each temperature from data obtained by measuring from −50° C. to 200° C. under measurement conditions in which a sample size is 10 mm in width and 20 mm in length between chucks, a frequency is 1 Hz, and a heating rate is 5° C./min. That is, the value at 25° C. is set as the tensile elastic modulus E'(25), and the value at 160° C. is set as the tensile elastic modulus E'(160).

The thickness of the base layer 521 is not limited, but can be set to be, for example, 50 μm or more and 200 μm or less, and the thickness is preferable to be 60 μm or more and 185 μm or less, and more preferable to be 70 μm or more and 170 μm or less. In addition, the base layer may or may not be stretched.

A resin is preferable as a material that constitutes the base layer 521, and of resins, a resin having sufficient flexibility (mechanical elasticity) is preferable, and a resin having an elastomeric property is particularly preferable.

Examples of the resin having an elastomeric property include thermoplastic elastomers, silicones, and the like. These may be used alone or in combination of two or more. Of these, a thermoplastic elastomer is preferable because a resin having thermoplasticity is preferable. The thermoplastic elastomer may be made of a prevent copolymer having a hard segment and a soft segment, may be made of a polymer alloy of a hard polymer and a soft polymer, or may have properties of both of them.

In the case of including the thermoplastic elastomer, the ratio thereof can be, for example, 30% by mass or more and 100% by mass or less based on the whole resin constituting the base layer 521. That is, the resin constituting the base layer 521 may be made only of the thermoplastic elastomer. The ratio of the thermoplastic elastomer is further preferable to be 50% by mass or more and 100% by mass or less, and more preferable to be 70% by mass or more and 100% by mass or less.

Examples of the thermoplastic elastomer include a polyester-based thermoplastic elastomer, a polyamide-based thermoplastic elastomer, a styrene-based thermoplastic elastomer, an olefin-based thermoplastic elastomer, a vinyl chloride-based thermoplastic elastomer, a polyimide-based thermoplastic elastomer (polyimide ester-based, polyimide urethane-based, or the like), and the like. These may be used alone or in combination of two or more.

Of these, a polyester-based thermoplastic elastomer, a polyamide-based thermoplastic elastomer, and a polyimide-based thermoplastic elastomer are preferable, and further, a polyester-based thermoplastic elastomer and/or a polyamide-based thermoplastic elastomer are particularly preferable.

The polyester-based thermoplastic elastomer may have any configuration, except that a polyester component is used as a hard segment. As a soft segment, polyester, polyether, polyether ester, or the like can be used. These may be used alone or in combination of two or more. That is, examples of a polyester component constituting the hard segment can include, for example, a structural unit derived from a monomer such as dimethyl terephthalate. On the other hand, examples of a component constituting the soft segment can include a structural unit derived from a monomer such as 1,4-butanediol and poly(oxytetramethylene)glycol.

More specifically, the examples include a PBT-PE-PBT polyester-based thermoplastic elastomer and the like.

Examples of such a polyester-based thermoplastic elastomer include "PRIMALLOY (trade name)" manufactured by Mitsubishi Chemical Corporation, "Hytrel (trade name)" manufactured by DU PONT-TORAY Co., Ltd., "PELPRENE (trade name)" manufactured by TOYOBO Co., Ltd., "HYPER ALLOY ACTYMER (trade name)" manufactured by RIKEN IECHNOS CORP., and the like. These may be used alone or in combination of two or more.

The polyamide-based thermoplastic elastomer may have any configuration, except that a polyamide component is used as a hard segment. As a soft segment, polyester, polyether, polyether ester, or the like can be used. These may be used alone or in combination of two or more. That is, examples of a polyamide component constituting the hard segment include, for example, polyamide 6, polyamide 11, polyamide 12, and the like. These may be used alone or in combination of two or more. Various lactams and the like can be used as monomers in these polyamide components. On the other hand, examples of a component constituting the soft segment can include a structural unit derived from a monomer, such as dicarboxylic acid, or polyether polyol. Of these, as the polyether polyol, polyether diols are preferable, and examples of them include, for example, poly(tetramethylene)glycol, poly(oxypropylene)glycol, and the like. These may be used alone or in combination of two or more.

More specifically, examples of them include a polyether amide-type polyamide-based thermoplastic elastomer, a polyester amide-type polyamide-based thermoplastic elastomer, a polyether ester amide-type polyamide-based thermoplastic elastomer, and the like.

Examples of such a polyamide-based thermoplastic elastomer include "Pebax (trade name)" manufactured by Arkema Inc., "Diamide (trade name)" manufactured by Daicel-Evonik Ltd., "VESTAMID (trade name)" manufactured by Daicel-Evonik Ltd., "UBESTA XPA (trade name)" manufactured by UBE INDUSTRIES, LTD., and the like. These may be used alone or in combination of two or more.

In a case where the base layer 521 contains a resin other than the thermoplastic elastomer, examples of such a resin include polyesters, polyamides, polycarbonates, acrylic resins, and the like. These may be used alone or in combination of two or more. Of these, polyesters and/or polyamides are preferable, and specifically, examples of them include polyesters such as polyethylene terephthalate, polybutylene terephthalate, polyethylene naphthalate, and polybutylene naphthalate, and polyamides such as nylon 6 and nylon 12.

Specifically, an example of the polybutylene terephthalate includes "Toraycon (trade name)" manufactured by TORAY INDUSTRIES, INC. This polybutylene terephthalate can be used alone as the base layer 521.

Further, the base layer 521 can contain, in the resin constituting the same, various additives such as a plasticizer and a softener (mineral oil or the like), a filler (carbonate, sulfate, titanate, silicate, oxide (titanium oxide, magnesium oxide), silica, talc, mica, clay, fiber filler, or the like), an antioxidant, a light stabilizer, an antistatic agent, a lubricant, a colorant, and the like. These may be used alone or in combination of two or more.

The holding layer 522 constituting the component holding film 52 is a layer formed, for example, of an adhesive material or the like, so that the component 55 can be held. The holding layer 522 may be provided only on one surface of the base layer 521, or may be provided on both surfaces of the base layer 521. The holding layer 522 may be provided in direct contact with the base layer 521, or may be provided via another layer.

The thickness of the holding layer 522 (the thickness on the side of one surface of the base layer 521) is not particularly limited; however, the thickness is preferable to be 1 μm or more and 40 μm or less, more preferable to be 2 μm or more and 35 μm or less, and particularly preferable to be 3 μm or more and 25 μm or less.

Of course, the holding layer 522 is a layer for providing the function to hold the component 55 to the component holding film 52, and is a layer that does not inhibit the characteristics of the base layer 521 from being reflected on the component holding film 52. Therefore, it is preferable that the holding layer 522 be a layer whose thickness is usually smaller than that of the base layer 521 and whose elastic moduli described before are each also smaller.

The adhesive material is only required to have the above characteristics, and may be made of any material. Usually, the adhesive material contains at least an adhesive main agent. Examples of the adhesive main agent include an acrylic adhesive, a silicone adhesive, a rubber adhesive, and the like. Also, this adhesive material can contain a cross-linking agent in addition to the adhesive main agent. Further, the adhesive material may be an energy ray-curable adhesive material that can be cured by energy rays (ultraviolet rays, electron beams, infrared rays, and the like) or an energy non-curable adhesive material that is not cured by energy rays.

[3] Component Manufacturing Method

In the present component manufacturing method including a setting step of chucking and fixing the component holding film 52 to the heated surface 21a of the chuck table 21, the component 55 to be held to the component holding film 52 is a component selected from a semiconductor component, a precursor of the semiconductor component, an electronic component, and a precursor of the electronic component, and the setting step includes a preventing step of preventing the heat convection X, occurring on the surface 21a of the chuck table 21, from contacting the component holding film 52 to which the component 55 is held (see FIGS. 3, 6, and 8).

The "preventing step" is a step of preventing the heat convection X, occurring on the surface (the chucking surface) 21a of the chuck table 21, from contacting the component holding film 52 to which the component 55 is held, when the component holding film 52, to which the component 55 is held, is chucked to the surface 21a of the chuck table 21. With the setting step including the preventing step, the component holding film 52 can be chucked and fixed to the heated chucking surface 21a.

The preventing step is only required to prevent the heat convection X from contacting the component holding film 52 and its specific method is not limited; however, this preventing can be achieved by specifically performing, for example: a gas blowing step of blowing gas (see FIGS. 3 and 8); a blocking step of interposing the blocking member 321 between the chucking surface 21a and the component holding film 52 (see FIG. 6); a chucking step of performing chucking; and the like. These steps may be used alone or in combination of two or more.

The "gas blowing step" is a step of blowing gas to prevent the heat convection X from contacting the component holding film 52 (see FIGS. 3b to 3d and 8d). Specifically, the heat convection X is destroyed by the sent-out wind Y, and with the destruction of the heat convection X, the heat convection X can be prevented from contacting the component holding film 52. Since heat convection is prevented by blowing gas, it is unnecessary to prevent heat convection by interposing an object between the component holding film 52 and the chucking surface 21a, and a mechanical mechanism for interposing and removing an object and a time for operating the mechanical mechanism are also not required. Therefore, heat convection can be surely prevented from when the component holding film 52 and the chucking surface 21a start facing each other to when they are about to contact each other.

A specific means in the gas blowing step is not limited, but the above gas blowing means 31 can be used.

The "blocking step" is a step of interposing the blocking member 321 between the component holding film 52 and the chucking surface 21a in order to prevent the heat convection X from contacting the component holding film 52 (see FIGS. 6b to 6d and 8b to 8d). With the interposition of the blocking member 321, not only the heat convection X can be prevented from contacting the component holding film 52, but also cooling of the chuck table 21 can be suppressed by blocking, with the blocking member 321, heat dissipation from the chucking surface 21a by the heat convection X. Its specific means is not limited, but the above blocking means 32 can be used.

The "setting step" is a step of chucking and fixing the component holding film 52 to the heated surface (the chucking surface) 21a of the chuck table 21. The setting step includes the preventing step. The setting step is only required to be capable of chucking and fixing the component holding film 52 to the heated chucking surface 21a and the others are not limited, but the step can include, for example, the following steps <1> to <5>, as illustrated in FIGS. 3a to 3e, 6a to 6e, and 8a to 8e:

<1> Waiting Step

A step of waiting for the component holding film 52 (the component holding tool 50) to be mounted on the mounting table 711 of the first transport means 71 in a state where the mounting table 711 is raised (see FIGS. 3a, 6a, and 8a).

<2> Arm Transport Step

A step of transporting the component holding tool 50 to the mounting table 711 of the first transport means 71 by using the arm 731 of the second transport means 73 (see FIGS. 3b, 6b, and 8b).

<3> Retracting Step

A step of retracting the arm 731 of the second transport means 73 that has mounted the component holding tool 50 on the mounting table 711 of the first transport means 71 (see FIGS. 3c, 6c, and 8c).

<4> Rail Transport Step

A step of bringing the component holding tool 50, in a state of being maintained approximately horizontally, close to the chucking surface 21a by lowering the transport rail 712 of the first transport means 71 (see FIGS. 3d, 6d, and 8d).

<5> Chucking and Fixing Step

A step of chucking and fixing the component holding film 52 to the chucking surface 21a by chucking from the chuck table 21 when the component holding film 52 contacts the chucking surface 21a (see FIGS. 3e, 6e, and 8e).

That is, it is preferable to perform the preventing step along with other steps, not alone, as illustrated in FIGS. 3, 6, and 8.

For example, in FIG. 3, the gas blowing step is performed along with each of the arm transport step, the retracting step, and the rail transport step. Also, in FIG. 6, the blocking step is performed along with each of the arm transport step, the retracting step, and the rail transport step. Further, in FIG. 8, the gas blowing step is performed along with the rail transport step, and the gas blowing step is performed along with each of the arm transport step, the retracting step, and the rail transport step.

Further, when the present method includes a transport step (e.g., the above <4> rail transport step), the transport step can be a step of lowering the component holding film 52 maintained appropriately horizontally toward the chucking surface 21a, or a step of raising the chucking surface 21a toward the component holding film 52 maintained appropriately horizontally (see FIGS. 3d, 6d, and 8d).

A transport step of bringing the chucking surface 21a and the component holding film 52, which are maintained approximately horizontally, close to each other in order to contact each other, as described above, has been known, as a single step, in conventional component manufacturing methods; however, the conventional component manufacturing methods do not include the preventing step. Therefore, in those methods, a time, during which the heat convection X is contacting the component holding film 52 during the transport step, is long and an influence of the heat convection is great. On the other hand, the present component manufacturing method includes the preventing step, and hence the heat convection X can continue to be prevented during the transport. In this sense, when the present component manufacturing method includes the transport step, an action, obtained when the preventing step is included, can be obtained more effectively.

A distance between the component holding film 52 and the chucking surface 21a (a distance of the shortest portion), occurring just before the transport step is started, is not limited; however, in the present component manufacturing method, the distance is preferable to be 300 mm or less (usually 1 mm or more), more preferable to be 200 mm or less, further preferable to be 100 mm or less, and particularly preferable to be 50 mm or less.

The present component manufacturing method can include other steps in addition to the setting step, the preventing step, and the transport step. Examples of the other steps include an evaluation step, a dividing step, a pickup step, and the like. These other steps may be used alone or in combination of two or more.

The dividing step is a step of dividing the components 55 that are not yet divided, such as a semiconductor wafer or an array-shaped electronic component.

The evaluation process is a step of evaluating the component 55. An evaluation method is not particularly limited; however, examples of the evaluation method include, for example: an electrical characteristics evaluation method for evaluating electrical characteristics of the component 55 (a method for evaluating electrical characteristics by using a plurality of probes, a probe card in which the probes are arranged, or the like); an appearance characteristics evaluation method for evaluating appearance characteristics of the component 55 (a method for evaluating appearance characteristics by using a non-contact optical evaluation means, or the like); and the like. When there are multiple components 55 held to the component holding film 52, all the components 55 may be evaluated in the evaluation step, or only some components 55 may be evaluated.

The pickup step is a step of, after the evaluation step, stretching the component holding film 52 by pushing only some components 55' of the components 55 from a side of the base layer 521 toward a side of the holding layer 522 with a push-up member 92, so that the some components 55' are separated from the other components 55 and are picked up by using a collet 93 or the like. That is, when the component holding film 52 is shared between the setting step and the pickup step, the component holding film 52 is required to have flexibility in the pickup step, in addition to heat resistance to be required in the setting step.

Figure 11A:
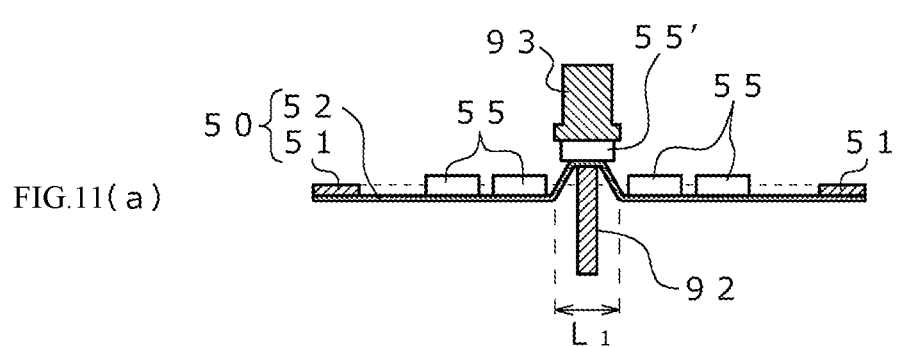
FIG. 11 is an explanatory view for explaining a pickup step.
Figure 11B:
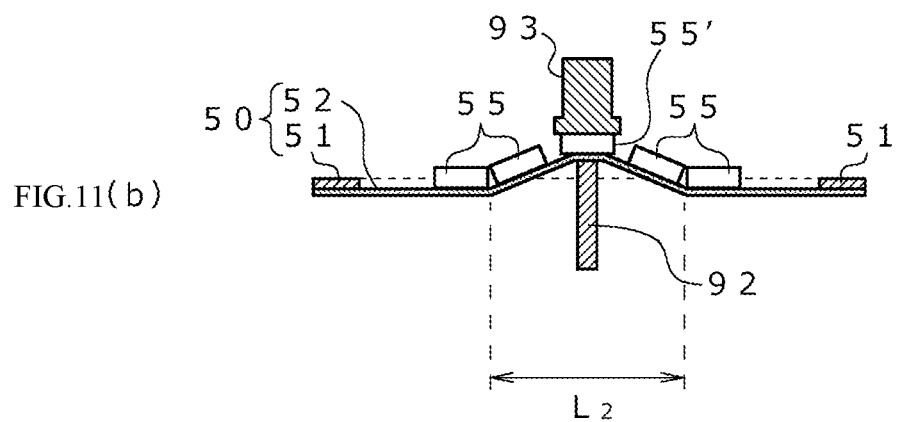

Specifically, it is preferable that the component holding film 52 have flexibility in which only a portion of the film 52, to which the components 55' to be picked up are caused to adhere, can be deformed. That is, it is preferable that the component holding film 52 have flexibility in which the area of a peripheral film to be lifted following the pushup with the push-up member 92 can be reduced, and a diameter $L_1$ of a circular portion to be lifted with the pushup can be reduced, as illustrated in FIG. 11(a). When the flexibility of the component holding film 52 is poor, the area of a peripheral film to be lifted following the pushup with the push-up member 92 becomes large, and a diameter $L_2$ of a circular portion to be lifted with the pushup becomes large, as illustrated in FIG. 11(b). In this case, unintentional components 55' not to be picked up may be lifted, and further a failure may occur, in which components collide with each other, or the like (see FIG. 11b). With respect to this point, the component holding film 52, in which the above ratio $R_{E1}$ (=E'(160)/E'(25)) of the base layer 521 is 0.2 or less and E'(25) is 400 MPa or less, can be shared between the setting step and the pickup step.

EXAMPLES

Hereinafter, the present invention will be specifically described by way of examples.

[1] Manufacture of Component Holding Tool

<1> Manufacture of Component Holding Film 52

Experimental Example 1

A polyester-based thermoplastic elastomer (TPEE) film having a thickness of 80 μm was prepared as the base layer 521. This film was used to measure the tensile elastic modulus E' by a dynamic viscoelasticity measuring device (DMA: Dynamic Mechanical Analysis) (product name: RSA-3, manufactured by TA Instruments, Inc.). Specifically, data at each temperature was read from data obtained by measuring from −50° C. to 200° C. under measurement conditions in which a sample size was 10 mm in width and 20 mm in length between chucks, a frequency was 1 Hz, and a heating rate was 5° C./min. That is, the value at 25° C. was set as the tensile elastic modulus E'(25), and the value at 160° C. was set as the tensile elastic modulus E'(160), which were shown in Table 1. Further, the value of the ratio $R_{E1}$ (=E'(160)/E'(25)) was calculated by using these values, and the results thereof were also shown in Table 1. As a result, the ratio $R_{E1}$ was 0.13 in Experimental Example 1.

Next, as the holding layer 522, a non-curable acrylic adhesive having a thickness of 10 μm was laminated on one surface of the base layer 521 to obtain a component holding film 52 of Experimental Example 1.

Experimental Example 2

A polyester-based thermoplastic elastomer (TPEE) film having a thickness of 150 μm was prepared as the base layer 521. This film is a film whose thickness is only different from the film of Experimental Example 1. A component holding film 52 of Experimental Example 2 was obtained by setting the others to be the same as in Experimental Example 1.

Experimental Example 3

A polyester-based thermoplastic elastomer (TPEE) film having a thickness of 120 μm was prepared as the base layer 521. Like Experimental Example 1, this film was used to measure the tensile elastic modulus E' and to calculate the ratio $R_{E1}$, the results of which were shown in Table 1. As a result, the ratio $R_{E1}$ was 0.15 in Experimental Example 3. A component holding film 52 of Experimental Example 3 was obtained by setting the others to be the same as in Experimental Example 1.

Experimental Example 4

A nylon-based thermoplastic elastomer (TPAE) film having a thickness of 150 μm was prepared as the base layer 521.

Like Experimental Example 1, this film was used to measure the tensile elastic modulus E' and to calculate the ratio $R_{E1}$, the results of which were shown in Table 1. As a result, the ratio $R_{E1}$ was 0.0038 in Experimental Example 4. A component holding film 52 of Experimental Example 4 was obtained by setting the others to be the same as in Experimental Example 1.

TABLE 1

| Experimental Example | | | 1 | 2 | 3 | 4 |
|---|---|---|---|---|---|---|
| Component holding film (Base layer) | Resin | | TPEE | TPEE | TPEE | TPAE |
| | Thickness (μm) | | 80 | 150 | 120 | 150 |
| | Linear thermal expansion coefficient (ppm/K) | | 210 | | 220 | 200 |
| | E'(25) (MPa) | | 95 | | 56 | 72 |
| | E'(160) (MPa) | | 12 | | 8.5 | 0.27 |
| | $R_{E1}$ | | 0.13 | | 0.15 | 0.0038 |
| Chucking and Fixation | Temperature 100° C. | Preventing tool absent | x | Δ | Δ | Δ |
| | | Preventing tool present | o | o | o | o |
| | Temperature 150° C. | Preventing tool absent | x | x | x | x |
| | | Preventing tool present | o | o | o | o |

<2> Manufacture of Component Holding Tool

The holding layer 522 of each of the component holding films 52 of Experimental Examples 1 to 4 was caused to adhere to one surface of the frame body 51 so as to cover the opening of the metal frame body 51 (ring frame), so that the component holding tool 50 was manufactured (see FIG. 9, but the component 55 was not held).

[2] Chucking and Fixation

With the component manufacturing apparatus and the component manufacturing method illustrated in FIG. 3, the surface of the base layer 521 of the component holding film 52 of each of the component holding tools 50 of Experimental Examples 1 to 4 was chucked and fixed to the chucking surface 21a of the chuck table 21 of a vacuum chuck type, the chucking surface 21a being heated to each of 100° C. and 150° C.

At this time, the air blowing means 31 was used as the preventing means 30, in which the wind Y (room temperature) was blown at an air flow of 3.3 m³/min. The air was blown only from one side so as to be appropriately parallel to the chucking surface 21a (only one sending part was used) (see FIG. 5a). Further, the distance between the top surface of the base layer 521 of the component holding film 52 and the chucking surface 21a was set to 2 cm. Furthermore, the time from when the component holding tool 50 was mounted on the first transport means 71 to when the component holding film 52 contacted the chucking surface 21a was set to 30 seconds. Still furthermore, comparison was made at each temperature between a case where the preventing means 30 was operated and a case where the means 30 was not operated.

Observation results when these chucking and fixation were performed were evaluated according to the following criteria, the results of which were shown in Table 1.

"o": well chucked and fixed.
"Δ": able to be chucked and fixed, but a slight wrinkle was observed.
"x": the component holding film was corrugated, and it was not able to be chucked and fixed.

[3] Effect of Examples

From the results in Table 1, when the preventing means was absent and when the component holding film was chucked and fixed to the chucking surface at 100° C., occurrence of a wrinkle was observed before the component holding film contacted the chucking surface in Experimental Example 1 in which the thickness of the component holding film was small, and chucking and fixation was not able to be performed because of the wrinkle. On the other hand, chucking and fixation was able to be achieved in Experimental Examples 2 to 4, but a wrinkle was observed after the chucking and fixation, and hence there was a fear that a failure might occur depending on chucking conditions. Further, when the component holding film was chucked and fixed to the chucking surface at 150° C., occurrence of a wrinkle was observed before the component holding film contacted the chucking surface in all of Experimental Examples 1 to 4, and chucking and fixation was not able to be performed because of the wrinkle.

On the other hand, when the preventing means was present, occurrence of a wrinkle was not observed before and after the contact between the component holding film and the chucking surface in all of Experimental Examples, regardless of the temperature of the chucking surface, whereby normal chucking and fixation was able to be achieved. From these results, it was particularly confirmed that preventing of heat convection has remarkable effects on prevention of occurrence of a wrinkle before the contact between the component holding film and the chucking surface, and on normal chucking and fixation of the component holding film to the chucking surface.

Note that the present invention is not limited to the above specific examples but can be variously modified within the scope of the present invention depending on the purpose and use.

Further, part or the whole of each gas blowing means 31 in FIGS. 1, 3 to 5, and 8 can be replaced by a "chucking means 33" (when the gas blowing means 31 and the chucking means 33 are used in combination, only part of the gas blowing means 33 is replaced). Furthermore, when it is replaced by the chucking means 33, each sending part 311 shall be replaced by a "chucking part 331." As described above, the chucking means 33 is a means that performs chucking in order that the wind Y is formed by the chucking, and a means that destroys heat convection by the wind Y, and the chucking part 331 usually has an opening that can suck the wind Y. Still furthermore, the wind for the chucking can be formed by using the wind forming part described in the gas blowing means 311. That is, when the above fan with swivelable wings is used, chucking can be performed by rotating these wings in the opposite direction to that during gas blowing.

INDUSTRIAL APPLICABILITY

The component manufacturing apparatus and the component manufacturing method of the present invention are widely used in applications of semiconductor component manufacturing and electronic component manufacturing. Particularly, when a component manufacturing method including an evaluation step under a heated environment is used, the component manufacturing apparatus and the component manufacturing method can be suitably used from the viewpoint of performing component manufacture excellent in productivity.

REFERENCE SIGNS LIST

1 Component manufacturing apparatus
19 Conventional component manufacturing apparatus
20 Chucking and fixing means
21 Chuck table
21a Surface (Chucking surface) of chuck table
30 Preventing means
31 Gas blowing means
311 Sending part
32 Blocking means
321 Blocking member
322 Blocking member
323 Blocking member
50 Component holding tool
51 Frame body
511 Inner frame
512 Outer frame
52 Component holding film
521 Base layer
522 Holding layer
522a Holding surface
55 Component
71 Transport means (First transport means)
711 Mounting table
712 Transport rail
73 Transport means (Second transport means)
731 Arm
92 Member
93 Collet
M Region around component
X Heat convection
Y Wind
Z Wrinkle

The invention claimed is:

1. A component manufacturing apparatus comprising a chucking and fixing means that chucks and fixes a component holding film to a heated surface of a chuck table, wherein
 a component to be held to the film is a component selected from the group consisting of a semiconductor component, a precursor of the semiconductor component, an electronic component, and a precursor of the electronic component, and
 the apparatus comprises a preventing means that prevents heat convection, occurring on the surface of the chuck table, from contacting the film to which the component is held,
 wherein the preventing means is a means that interposes a blocking member between the surface of the chuck table and the film,
 wherein the apparatus comprises a transport means, and the transport means is a means that lowers the film toward the surface of the chuck table, or a means that raises the surface of the chuck table toward the film so as to bring the film and the surface of the chuck table into contact with each other.

2. The component manufacturing apparatus according to claim 1, wherein the chucking and fixing means has a chuck table that has a flat chucking surface, and
 the chucking surface includes chucking holes and/or chucking grooves that are connected to a chucking source for chucking.

3. The component manufacturing apparatus according to claim 1, wherein the blocking member has a single plate or a plurality of plates that can cover the chucking surface.

4. The component manufacturing apparatus according to claim 1, wherein the transport means is a means that lowers the film maintained horizontally toward the surface of the chuck table, or a means that raises the surface of the chuck table toward the film maintained horizontally.

5. A component manufacturing apparatus comprising a chucking and fixing means that chucks and fixes a component holding film to a heated surface of a chuck table, wherein
    a component to be held to the film is a component selected from the group consisting of a semiconductor component, a precursor of the semiconductor component, an electronic component, and a precursor of the electronic component, and
    the apparatus comprises a preventing means that prevents heat convection, occurring on the surface of the chuck table, from contacting the film to which the component is held,
    wherein the preventing means is a means that blows gas,
    wherein the apparatus comprises a transport means, and the transport means is a means that lowers the film toward the surface of the chuck table, or a means that raises the surface of the chuck table toward the film so as to bring the film and the surface of the chuck table into contact with each other.

6. The component manufacturing apparatus according to claim 5, wherein the chucking and fixing means has a chuck table that has a flat chucking surface, and
    the chucking surface includes chucking holes and/or chucking grooves that are connected to a chucking source for chucking.

7. The component manufacturing apparatus according to claim 5, wherein the gas blowing means has a wind forming part that forms the wind and a guide path.

8. A component manufacturing method comprising a setting step of chucking and fixing a component holding film to a heated surface of a chuck table, wherein
    a component to be held to the film is a component selected from the group consisting of a semiconductor component, a precursor of the semiconductor component, an electronic component, and a precursor of the electronic component, and
    the setting step includes a preventing step of preventing heat convection, occurring on the surface of the chuck table, from contacting the film to which the component is held,
    wherein the preventing step is a step of interposing a blocking member between the surface of the chuck table and the component holding film,
    wherein the setting step includes a transport step, and the transport step is a step of lowering the film toward the surface of the chuck table, or a step of raising the surface of the chuck table toward the film so as to bring the film and the surface of the chuck table into contact with each other.

9. The component manufacturing method according to claim 8, wherein
    the film includes a holding layer that holds the component and a base layer that supports the holding layer, and
    a linear thermal expansion coefficient of the base layer is 100 ppm/K or more.

10. The component manufacturing method according to claim 8, wherein a ratio $R_{E1}$ (=E'(160)/E'(25)) of an elastic modulus at 160° C. of the base layer to an elastic modulus at 25° C. of the base layer is 0.2 or less, and E'(25) is 400 MPa or less.

11. A component manufacturing method comprising a setting step of chucking and fixing a component holding film to a heated surface of a chuck table, wherein
    a component to be held to the film is a component selected from the group consisting of a semiconductor component, a precursor of the semiconductor component, an electronic component, and a precursor of the electronic component, and
    the setting step includes a preventing step of preventing heat convection, occurring on the surface of the chuck table, from contacting the film to which the component is held,
    wherein the preventing step is a step of blowing gas,
    wherein the setting step includes a transport step, and the transport step is a step of lowering the film toward the surface of the chuck table, or a step of raising the surface of the chuck table toward the film so as to bring the film and the surface of the chuck table into contact with each other.

12. The component manufacturing method according to claim 11, wherein
    the film includes a holding layer that holds the component and a base layer that supports the holding layer, and
    a linear thermal expansion coefficient of the base layer is 100 ppm/K or more.

13. The component manufacturing method according to claim 11, wherein a ratio $R_{E1}$ (=E'(160)/E'(25)) of an elastic modulus at 160° C. of the base layer to an elastic modulus at 25° C. of the base layer is 0.2 or less, and E'(25) is 400 MPa or less.

\* \* \* \* \*